(12) United States Patent
Micheloni et al.

(10) Patent No.: US 8,694,855 B1
(45) Date of Patent: Apr. 8, 2014

(54) ERROR CORRECTION CODE TECHNIQUE FOR IMPROVING READ STRESS ENDURANCE

(75) Inventors: Rino Micheloni, Turate (IT); Luca Crippa, Busnago (IT); Alessia Marelli, Dalmine (IT)

(73) Assignee: PMC-Sierra US, Inc., Sunnyvale, CA (US)

( * ) Notice: Subject to any disclaimer, the term of this patent is extended or adjusted under 35 U.S.C. 154(b) by 102 days.

(21) Appl. No.: 13/287,443

(22) Filed: Nov. 2, 2011

(51) Int. Cl.
*G11C 29/00* (2006.01)

(52) U.S. Cl.
USPC ............................ 714/763; 714/781; 714/704

(58) Field of Classification Search
CPC ............ G06F 11/1076; G06F 11/1008; G06F 11/1068
USPC ......... 714/710, 718, 763, 360, 365, 369, 768, 714/764, 752; 360/26, 47, 53; 365/200, 201
See application file for complete search history.

(56) References Cited

U.S. PATENT DOCUMENTS

| | | | |
|---|---|---|---|
| 815,137 A * | 3/1906 | Beecher ................... 123/185.13 |
| 5,732,092 A * | 3/1998 | Shinohara ..................... 714/764 |
| 6,539,515 B1 | 3/2003 | Gong |
| 6,976,197 B2 * | 12/2005 | Faust et al. .................... 714/723 |
| 7,206,992 B2 | 4/2007 | Xin |
| 7,237,183 B2 | 6/2007 | Xin |
| 7,937,641 B2 * | 5/2011 | Amidi ........................... 714/758 |
| 7,958,430 B1 * | 6/2011 | Kolokowsky et al. ........ 714/763 |
| 7,975,193 B2 * | 7/2011 | Johnson ........................ 714/723 |
| 8,176,367 B2 * | 5/2012 | Dreifus et al. ............... 714/47.3 |
| 8,219,894 B2 | 7/2012 | Au et al. |
| 8,245,112 B2 * | 8/2012 | Hicken et al. ................. 714/766 |
| 8,245,117 B1 | 8/2012 | Wu |
| 8,255,770 B2 | 8/2012 | Park et al. |
| 8,261,136 B2 * | 9/2012 | D'Abreu et al. ............. 714/708 |
| 8,281,227 B2 | 10/2012 | Thatcher et al. |
| 8,286,004 B2 * | 10/2012 | Williams ...................... 713/193 |
| 8,307,258 B2 * | 11/2012 | Flynn et al. ................... 714/763 |
| 8,327,220 B2 | 12/2012 | Borchers et al. |
| 8,335,977 B2 | 12/2012 | Weingarten et al. |
| 8,402,201 B2 | 3/2013 | Flynn et al. |
| 8,429,497 B2 * | 4/2013 | Tu et al. ........................ 714/764 |
| 2003/0033567 A1 * | 2/2003 | Tamura et al. ................ 714/718 |

(Continued)

OTHER PUBLICATIONS

NVM Express, Revision 1.0; Intel Corporation; Mar. 1, 2011.

*Primary Examiner* — Esaw Abraham
*Assistant Examiner* — Osman Alshack
(74) *Attorney, Agent, or Firm* — Kenneth Glass; Stanley J. Pawlik; Glass & Associates

(57) ABSTRACT

A data storage device reads a data unit from a memory page, detects a number of data bit errors in the data unit, and generates a bit error indicator identifying bit indexes of the data bit errors in the data unit. The data storage device reads the data unit from the memory page once again and generates a corrected data unit by correcting data bit errors in the data unit based on the error correction code if the number of data bit errors in the data unit does not exceed an error correction capacity of the error correction code. Otherwise, the data storage device generates a modified data unit based on the data unit by negating at least one erroneous data bit the data unit based on the bit error indicator and corrects any remaining data bit errors in the modified data unit based on the error correction code.

20 Claims, 11 Drawing Sheets

(56) References Cited

U.S. PATENT DOCUMENTS

| | | |
|---|---|---|
| 2004/0181735 A1 | 9/2004 | Xin |
| 2005/0248999 A1* | 11/2005 | Tamura et al. ............... 365/200 |
| 2007/0050688 A1 | 3/2007 | Thayer |
| 2007/0089031 A1* | 4/2007 | Huffman et al. ............. 714/763 |
| 2008/0005382 A1 | 1/2008 | Mimatsu |
| 2008/0229079 A1 | 9/2008 | Flynn et al. |
| 2008/0229164 A1* | 9/2008 | Tamura et al. ............... 714/721 |
| 2008/0256292 A1 | 10/2008 | Flynn et al. |
| 2009/0327802 A1 | 12/2009 | Fukutomi et al. |
| 2010/0199149 A1 | 8/2010 | Weingarten |
| 2010/0211737 A1 | 8/2010 | Flynn et al. |
| 2010/0211852 A1* | 8/2010 | Lee et al. ..................... 714/773 |
| 2010/0293440 A1 | 11/2010 | Thatcher |
| 2011/0072331 A1* | 3/2011 | Sakaue et al. ................ 714/763 |
| 2011/0246853 A1 | 10/2011 | Kim |
| 2011/0296084 A1* | 12/2011 | Nango ......................... 711/103 |
| 2012/0054413 A1 | 3/2012 | Brandt |

* cited by examiner

FIG. 6

| 600 Data Bit 0 | 600 Data Bit 1 | 600 Data Bit 2 | 600 Data Bit 3 | 600 Data Bit 4 | 600 Data Bit 5 | 600 Data Bit 6 | 600 Data Bit 7 | ... | 600 Data Bit N-1 |

| 700 Data Segment 0 | | 700 Data Segment 1 | | ... | 700 Data Segment M-1 | |
|---|---|---|---|---|---|---|
| 600 Data Bit 0 | ... | 600 Data Bit N-1 | 600 Data Bit 0 | ... | 600 Data Bit N-1 | 600 Data Bit 0 | ... | 600 Data Bit N-1 |

305

ERROR CORRECTION CODE TECHNIQUE FOR IMPROVING READ STRESS ENDURANCE

CROSS-REFERENCES TO RELATED APPLICATIONS

The present application is related to U.S. patent application Ser. No. 12/913,716 filed on Oct. 27, 2010 and entitled "BCH Data Correction System and Method" U.S. patent application Ser. No. 13/023,336 filed on Feb. 8, 2011 and entitled "Non-volatile Memory Controller with Two Stage Error Correction Technique for Enhanced Reliability", and U.S. patent application Ser. No. 13/330,573 filed on Dec. 19, 2011 and entitled "Shuffler Error Correction Code System and Method."

BACKGROUND

A NAND flash storage is typically divided into storage blocks. These storage blocks are further divided into memory pages. Although data may be read from any memory page of a storage block in a random access fashion, writing data to a memory page of the storage block typically requires a program-erase cycle. In the program-erase cycle, all data bits in the storage block are set to a value of one in an erase operation. Selected bits in the storage block are then changed from a value of one to a value of zero in a program operation. In this way, the data is written into the memory page of the storage block. Because program-erase cycles cause wear to a storage block, a probability of data bit errors in a memory page of the storage block increases as program-erase cycles are performed on the storage block. Moreover, the storage block has a lifetime which is typically determined by the number of program-erase cycles performed on the storage block. The number of program-erase cycles that may be performed during the lifetime of the storage block is sometimes referred to as the write endurance of the storage block.

In addition to wear caused to storage blocks by program-erase cycles, an individual memory page of a storage block may wear as a result of read operations performed on the storage block. As a result, data read from the memory page has a higher probability of data bit errors as the number of read operations performed on the storage block increases. Moreover, the memory page has a lifetime which is typically determined by the number of read operations performed on the storage block. The number of read operations that may be performed during the lifetime of the memory page is sometime referred to as the read endurance of the storage block.

In addition to wear caused by read operations performed on a memory page during the lifetime of the memory page, a memory page is susceptible to read disturbance occurring between program-erase cycles performed on the storage block containing the memory page. Read disturbance occurs when one or more data bits in data stored in a memory page of a storage block become corrupted as a result of a read operation performed on the memory block or an adjacent memory page. Typically, read disturbance occurs when one or more data bits in the data inadvertently change from a value of one to a value of zero when a read operation is performed on a nearby memory page. Each of the data bits corrupted as a result of the read disturbance of the memory page is a data bit error in the data. Moreover, the data bits usually remain corrupted until the memory page is reprogrammed in a subsequent program-erase cycle. As a result, the probability of data bit errors of a memory page increases temporarily as read operations are performed on the storage block between program-erase cycles performed on the storage block.

SUMMARY

In various embodiments, a data storage device stores a data unit into a memory page of a storage block in a data storage device. The data storage device reads the data unit from the memory page in a read operation, detects data bits errors in the data unit, and generates a corrected data unit by correcting the data bit errors in the data unit based on an error correction code. Additionally, the data storage device generates a bit error indicator identifying bit indexes of the data bit errors in the data unit. The data storage device then reads the data unit from the memory page in a subsequent read operation and attempts to correct any data bit errors in the data unit based on the bit error indicator and the error correction code for the data unit. In some embodiments, the data storage device first corrects any data bit errors in the data unit based on the bit error indicator and then corrects any remaining data bit errors in the data unit based on the error correction code for the data unit. In this way, the data storage controller extends the error correction capacity of the error correction code for the data unit.

Because the data storage controller uses a bit error indicator to extend the error correction capacity of an error correction code for the data unit, the data storage system has a higher level of data integrity than other data storage systems that do not employ such a bit error indicator. Moreover, the data storage controller extends the life of the storage block including the memory page by increasing the number of read operations that may be performed on the memory page before requiring a program-erase cycle to be performed on the storage block. In this way, the data storage controller reduces the number of program-erase cycles performed on the storage block in comparison to other data storage systems.

A system, in accordance with one embodiment, includes a data storage module and a data storage controller coupled to the data storage module. The data storage module includes a storage block having a memory page. The data storage controller reads data from, and writes data to, the data storage module. The data storage controller includes an error correction module for reading a data unit from the memory page. The error correction module generates a corrected data unit by using an error correction code when a number of data bit errors in the data unit do not exceed an error correction capacity of the error correction code. Additionally, the data storage controller includes a bit error indicator generator for generating a bit error indicator for a data bit error detected in the data unit and storing the bit error indicator into the data storage module. The bit error indicator includes a bit index of the erroneous data bit and indicates a correct bit value for the data bit error. The data storage controller also includes a bit manipulation module operable upon a subsequent reading of the data unit from the memory page to generate a modified data unit by using the bit error indicator to correct the erroneous data bit. Furthermore, the data storage controller is operable to use the error correction code to generate a corrected data unit based on the modified data unit.

A method, in accordance with one embodiment, includes generating an error correction code for a data unit. The error correction code has an error correction capacity for correcting up to a predetermined number of data bit errors in the data unit. The method also includes storing the data unit into a memory page of a storage block, reading the data unit from the memory page in a first read operation, and detecting a number of data bit errors in the data unit read from the memory page in the first read operation based on the error correction code. Further, the method includes initializing a bit error indicator identifying a bit index of each data bit being a data bit error in the data unit read from the memory page in the first read operation and indicating a correct bit value of the data bit. Additionally, the method includes reading the data unit from the memory page in a second read operation subsequent to the first read operation. The method further includes generating a modified data unit based on the data unit read from the memory page in the second read operation by setting each data bit in the modified data unit at a respective bit index identified by the bit error indicator to the correct bit value of the data bit. The method also includes detecting a number of data bit errors in the modified based on the error correction code, and generating a corrected data unit by correcting the number of data bit errors in the modified data unit based on the error correction code.

A system, in accordance with one embodiment, includes a data storage module and a data storage controller coupled to the data storage module. The data storage module includes a storage block having a memory page. The data storage controller reads data from, and writes data to, the data storage module. The data storage controller includes an error correction module for reading a data unit from the memory page. The error correction module generates a corrected data unit by using an error correction code when a number of data bit errors in the data unit do not exceed an error correction capacity of the error correction code. Additionally, the data storage controller includes a bit error indicator generator for generating a bit error indicator for a data bit error detected in the data unit and storing the bit error indicator into the data storage module. The bit error indicator includes a bit index of an erroneous data bit having a predetermined bit value as a correct bit value. The data storage controller further includes a bit manipulation module operable upon a subsequent reading of the data unit from the memory page to generate a modified data unit by using the bit error indicator to correct the erroneous data bit. Furthermore, the data storage controller is operable to use the error correction code to generate a corrected data unit based on the modified data unit.

A method, in accordance with one embodiment, includes generating an error correction code for a data unit. The error correction code has an error correction capacity for correcting up to a predetermined number of data bit errors in the data unit. The method further includes storing the data unit into a memory page of a storage block, reading the data unit from the memory page in a first read operation, and detecting a number of data bit errors in the data unit read from the memory page in the first read operation based on the error correction code. Additionally, the method includes initializing a bit error indicator identifying a bit index of each data bit being a data bit error in the data unit read from the memory page in the first read operation and having a predetermined bit value as a correct bit value. Further, the method includes reading the data unit from the memory page in a second read operation subsequent to the first read operation. The method also includes generating a modified data unit based on the data unit read from the memory page in the second read operation by setting each data bit in the modified data unit at a respective bit index identified by the bit error indicator to the predetermined bit value. Additionally, the method includes detecting a number of data bit errors in the modified based on the error correction code, and generating a corrected data unit by correcting the number of data bit errors in the modified data unit based on the error correction code.

Because these methods use a bit error indicator to correct a number of data bits errors in a data unit exceeding an error correction capacity of an error correction code for the data unit, the data storage system has a higher level of data integrity than other methods that do not employ such a bit error indicator. Moreover, the method extends the life of the storage block containing the memory page by increasing the number of read operations that may be performed on the memory page before requiring a program-erase cycle to be performed on the storage block.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

FIG. 6 is a block diagram of a data unit, in accordance with an embodiment of the present invention.

FIG. 7 is a block diagram of a data unit, in accordance with an embodiment of the present invention.

DETAILED DESCRIPTION

In various embodiments, a data storage device reads a data unit from a memory page, detects a number of data bit errors in the data unit not exceeding an error correction capacity of an error correction code, and generates a bit error indicator identifying bit indexes of the data bit errors in the data unit. The data storage device reads the data unit from the memory page once again and corrects data bit errors in the data unit based on the error correction code if the number of data bit errors in the data unit does not exceed an error correction capacity of the error correction code. Otherwise, if the number of data bit errors in the data unit exceeds the error correction capacity of the error correction code, the data storage device modifies the data unit by negating at least one data bit of the data unit, based on the bit error indicator, and corrects the data bit errors in the modified data unit based on the error correction code. In some embodiments, the data storage device performs a recovery operation on the data unit if the number of data bit errors in the modified unit exceeds the error correction capacity of the error correction code.

Because the data storage controller uses a bit error indicator to correct a number of data bits errors in a data unit exceeding an error correction capacity of an error correction code for the data unit, the data storage system has a higher level of data integrity than other systems that do not employ such a bit error indicator. Moreover, the data storage controller extends the life of a storage block including the memory page by increasing the number of read operations that may be performed on the memory page before requiring a program-erase cycle to be performed on the storage block.

Figure 1:
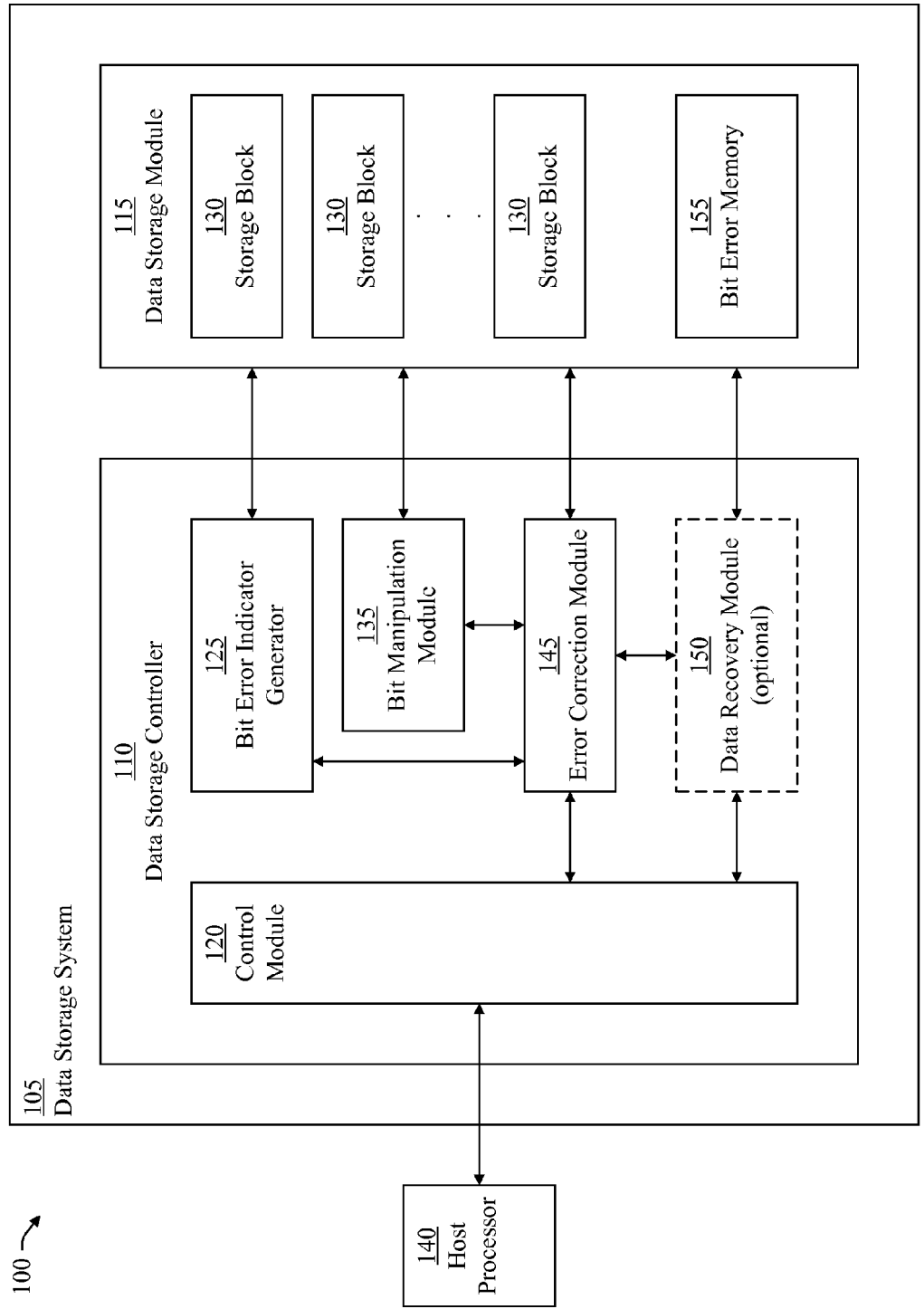
FIG. 1 is a block diagram of a data storage system, in accordance with an embodiment of the present invention.

FIG. 1 illustrates a computing system 100, in accordance with an embodiment of the present invention. The computing system 100 includes a host processor 140 and a data storage system 105 coupled (e.g., connected) to the host processor 140. The data storage system 105 includes a data storage controller 110 and a data storage module 115 coupled (e.g., connected) to the data storage controller 110. The data storage controller 110 includes a control module 120, a bit error indicator generator 125, a bit manipulation module 135, and an error correction module 145. Each of the bit error indicator generator 125 and the bit manipulation module 135 is coupled (e.g. connected) to the error correction module 145 and the data storage module 115. The error correction module 145 is coupled (e.g., connected) to the control module 120 and the data storage module 115. Moreover, the data storage module 115 includes storage blocks 130 for storing data.

The error correction module 145 generates an error correction code (ECC) for a data unit and corrects data bit errors in the data unit if the number of data bit errors does not exceed an error correction capacity of the error correction code. Additionally, the error correction module 145 corrects data bit errors in a modified data unit if the number of data bit errors in the modified data unit does not exceed the error correction capacity of the error correction code, as is described more fully herein.

The bit error indicator generator 125 generates a bit error indicator for a data unit based on the error correction code for the data unit. The bit manipulation module 135 generates a modified data unit based on the data by storing a copy of the data unit and modifying one or more data bits in the stored copy of the data unit that are identified as data bit errors by the bit error indicator. In this way, the bit manipulation module 135 corrects data bit errors (i.e., erroneous data bits) in the data unit based on the bit error indicator. In various embodiments, the bit manipulation module 135 corrects data bit errors in the modified data unit if the number of data bit errors in the data unit exceeds the error correction capacity of the error correction code for the data unit. In turn, the error correction module 145 corrects any errors remaining in the modified data unit based on the error correction code for the data unit.

In some embodiments, the data storage system 105 includes an optional data recovery module 150 coupled (e.g., connected) to the control module 120, the error correction module 145, and the data storage module 115. In various embodiments, the data storage system 105 may be any system or device for storing and managing data. For example, the data storage system 105 may be a data storage device, such as a flash storage device. In various embodiments, the data storage module 115 is a nonvolatile memory, such as a flash storage, and the data storage system 105 is a solid state drive (SSD).

The data storage module 115 also includes a bit error memory 155 for storing bit error indicators, as is described more fully herein. The bit error memory 155 may be any system, device, or component for storing data. For example, the bit error memory 155 may be a NAND flash storage, a NOR flash storage, a static random access memory (SRAM), a dynamic random access memory (DRAM), a electrically programmable read only memory (EPROM), an electrically erasable programmable read only memory (EEPROM), or the like. In some embodiments, the data storage module 115 is a NAND flash storage and the bit error memory 155 includes one or more memory pages in one or more storage blocks 130 of the NAND flash storage. In other embodiments, the bit error memory 155 is external to the data storage module 115.

In operation, the control module 120 receives a data write command and a data unit associated with the data write command from the host processor 140. The error correction module 145 generates an error correction code (ECC) for the data unit and writes (i.e., stores) the data unit and the error correction code for the data unit into one or more storage blocks 130 of the data storage module 115. The error correction code for the data unit includes redundancy information for detecting up to a predetermined number of data bits errors in the data unit and for correcting up to a predetermined number of data bit errors in the data unit. Moreover, the error correction code has an error correction capacity, which is the predetermined number of data bit errors correctable by using the error correction code.

In further operation, the control module 120 receives a data read command from the host processor 140. The error correction module 145 reads the data unit and the error correction code for the data unit from one or more storage blocks 130 of the data storage module 115. The error correction module 145 determines based on the error correction code whether the data unit has a number of data bit errors. If the data unit does not have any data bit errors, the control module 120 provides the data unit to the host processor 140. If the error correction module 145 determines the data unit has at least one data bit error, the error correction module 145 determines whether the number of data bit errors in the data unit exceeds the error correction capacity of the error correction code. If the number of data bit errors does not exceed the error correction capacity of the error correction code, the error correction module 145 generates a corrected data unit by correcting the data bit errors in the data unit based on the error correction code. In turn, the control module 120 provides the corrected data unit to the host processor 140. Furthermore, the bit error indicator generator 125 generates a bit error indicator indicating a bit index of each data bit error in the data unit. The bit error indicator generator 125 writes (e.g., stores) the bit error indicator into the bit error memory 155 (e.g., a storage block 130). In various embodiments, the error correction module 145 does not store the corrected data unit into a storage block 130 of the data storage module 115 to avoid performing a program-erase cycle on the storage block 130.

In further operation, the error correction module 145 subsequently reads the data unit and the error correction code for the data unit from one or more storage blocks 130 of the data storage module 115. The error correction module 145 determines based on the error correction code whether the data unit has a number of data bit errors. If the data unit has a number of data bit errors not exceeding the error correction capacity of the error correction code, the error correction module 145 generates a corrected data unit by correcting any data bit errors in the data unit based on the error correction code. In turn, the control module 120 provides the corrected data unit to the host processor 140.

Otherwise, if the data unit has number of data bit errors exceeding the error correction capacity of the error correction code, the bit manipulation module 135 reads the bit error indicator from the bit error memory 155 and generates a modified data unit by setting one or more data bits in the data unit at one or more respective bit indexes indicated by the bit error indicator to a correct bit value of the data bit. In this way, the bit manipulation module 135 corrects one or more data bits in the data unit based on the bit error indicator. The error correction module 145 determines based on the error correction code whether the modified data unit has a number of data bit errors. If the modified data unit has a number of data bit errors not exceeding the error correction capacity of the error correction code, the error correction module 145 generates a corrected data unit by correcting the data bit errors in the modified data unit based on the error correction code. By modifying one or more data bits in the modified data unit based on the bit error indicator and then detecting and correcting data bit errors in the modified data unit based on the error correction code, the data storage system 105 corrects a number of data bit errors in the data unit exceeding the error correction capacity of the error correction code for the data unit. In turn, the control module 120 provides the corrected data unit to the host processor 140.

In some embodiments, if the data unit has number of data bit errors not exceeding the error correction capacity of the error correction code, the bit manipulation module 135 reads the bit error indicator from the bit error memory 155 and generates a modified data unit by setting one or more data bits in the data unit at one or more respective bit indexes indicated by the bit error indicator to a correct bit value of the data bit. In this way, the bit manipulation module 135 corrects one or more data bits in the data unit based on the bit error indicator. The error correction module 145 determines based on the error correction code whether the modified data unit has a number of data bit errors. If the modified data unit has a number of data bit errors not exceeding the error correction capacity of the error correction code, the error correction module 145 generates a corrected data unit by correcting the data bit errors in the modified data unit based on the error correction code. Because the bit manipulation module 135 corrects one or more data bits in the data unit based on the bit error indicator, the error correction module 145 need not correct those data bits by using the error correction code of the data unit. In this way, the data manipulation module 135 uses the bit error indicator to assist (e.g., help) the error correction module 145 correct data bit errors in the data unit.

In various embodiments, data bit errors in a data unit are caused by read disturbance of a memory page containing the data unit. In some cases, the read disturbance of the memory page occurs as a result of reading data from the same storage block Once a data bit error occurs in a read operation of a data unit stored in a memory page as a result of read disturbance of the memory page, the same data bit error tends to reoccur in subsequent read operations of the data unit until a program-erase cycle is performed on the storage block 130 containing the memory page. In this way, the bit error indicator predicts the occurrence of data bit errors in the data unit caused by read disturbance of the memory page containing the data unit. Moreover, the data storage controller 110 generates a corrected data unit in which data bit errors in the data unit caused by a read disturbance are corrected based on the bit error indicator and the error correction code.

In these various embodiments, the data storage controller 110 identifies data bit errors in the data unit based on the bit error indicator, stores a copy of the data unit in the data storage controller 110, and generates the modified data unit by modifying (i.e., negating) the data bits in the stored copy of the data unit that are identified as data bit errors by the bit error indicator. In this way, the data storage controller 110 reduces a number of data bit errors in a data unit exceeding an error correction capacity of an error correction code to a number data bit errors in a modified data unit within an error correction capacity of the error correction code (i.e., not exceeding the error correction capacity of the error correction code). In various embodiments, the bit manipulation module 135 stores the copy of the data unit into a local storage, such as a data register in the bit manipulation module 135.

In various embodiments, each of the control module 120, the error correction module 145, and the data recovery module 150 may include one or more hardware components, one or more software components, or some combination thereof. Examples of hardware components include a combinational logic circuit, a sequential logic circuit, a microprocessor, an embedded processor, an embedded controller, or the like. Examples of software components include a computing program, computing instructions, a software routine, or the like. In various embodiments, the data storage module 115 may be any type of volatile or nonvolatile memory organized into storage blocks 130. For example, the data storage module 115 may be a flash storage, such as a NAND flash storage, in which an entire storage block 130 must be erased in a process of reprogramming (i.e., modifying data) in a memory page 200 contained in the storage block 130.

In various embodiments, the data storage system 105 is implemented in an integrated circuit of an integrated circuit device which may include an integrated circuit package containing the integrated circuit. In some embodiments, the data storage system 105 is implemented in a single integrated circuit die or chip. In other embodiments, the data storage system 105 is implemented in more than one integrated circuit die or chip of an integrated circuit device which may include a multichip package containing the integrated circuit die or chips.

Figure 2:
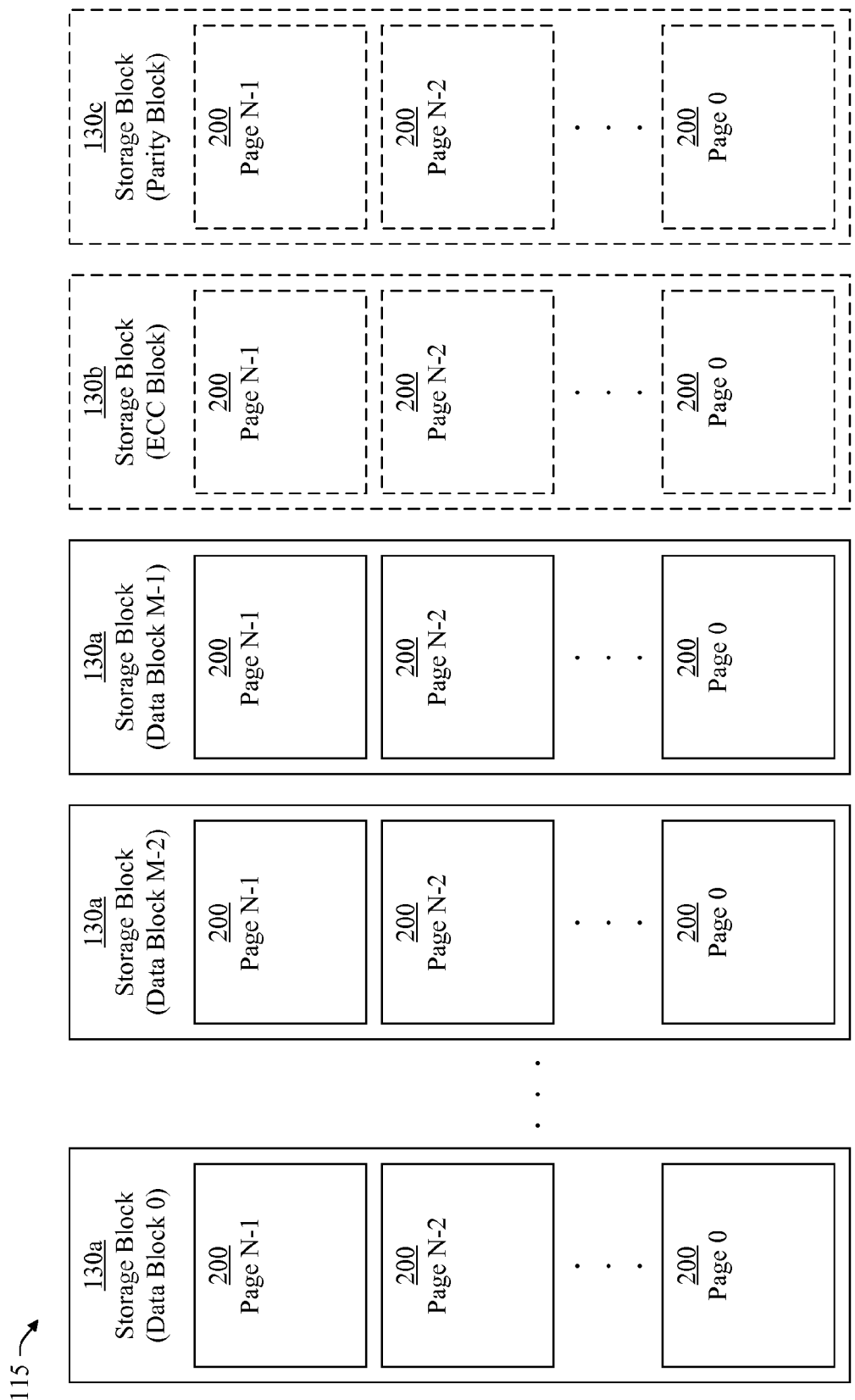
FIG. 2 is a block diagram of a data storage module, in accordance with an embodiment of the present invention.

FIG. 2 illustrates the data storage module 115, in accordance with an embodiment of the present invention. The data storage module 115 includes storage blocks 130 (i.e., storage blocks 130a-c), each of which includes a number of memory pages (Pages) 200. Each of the storage blocks 130 has N memory pages 200, each of which is identified by a memory page number in a sequence of memory page numbers from 0 to N−1.

As illustrated in FIG. 2, the storage blocks 130 of the data storage module 115 have various types, which include a number of data storage blocks (Data Blocks) 130a, an error correction code storage block (ECC Block) 130b, and a parity storage block (Parity Block) 130c. In the embodiment of FIG. 2, the data storage module 115 includes M data storage blocks 130a, an error correction code storage block 130b, and a parity storage block 130c. Each of the data storage blocks 130a is identified by a data block storage number in a sequence of data block storage numbers 0 through M−1. In various embodiments, the data storage system 105 stores a data unit and an error correction code unit for the data unit in a data storage block 130a. The data unit includes a number of data bits and each of the error correction codes includes a number of error bits for correcting data bit errors in the data unit.

In some embodiments, an error correction code storage block 130b or a parity storage block 130c, or both, are part of a data storage block 130*a*. In these embodiments, the data storage block 130*a* is storage block 130 of a NAND flash storage in the data storage module 115. Moreover, the error correction code storage block 130*b* or the parity storage block 130*c*, or both, are not physically separate from the data storage block 130*a*.

In various embodiments, each memory page 200 of a storage block 130 is divided into a data area and a spare area. In these embodiments, the data storage system 105 stores data units in the data areas of the memory pages 200 and stores error correction codes for the data units in the spare areas of the memory pages 200. In some embodiments, the data storage system 105 stores error correction codes for the data units in the error correction code storage block 130*b*. Although only a single error correction code storage block 130*b* and a single parity storage block 130*c* are illustrated in FIG. 2, the data storage module 115 may have any number of error correction code storage blocks 130*b* and any number of parity storage blocks 130*c* in other embodiments. In some embodiments, the error correction code storage block 130*b* is optional. In some embodiments, the parity storage block 130*c* is optional.

In various embodiments, the error correction module 145 reads the data unit and the error correction code unit for the data unit from the memory page 200 of the data storage module 115 in a single read operation. In this way, the error correction module 145 reads the data unit and the error correction code for the data unit substantially simultaneously from the memory page 200 of the storage block 130.

Figure 3:
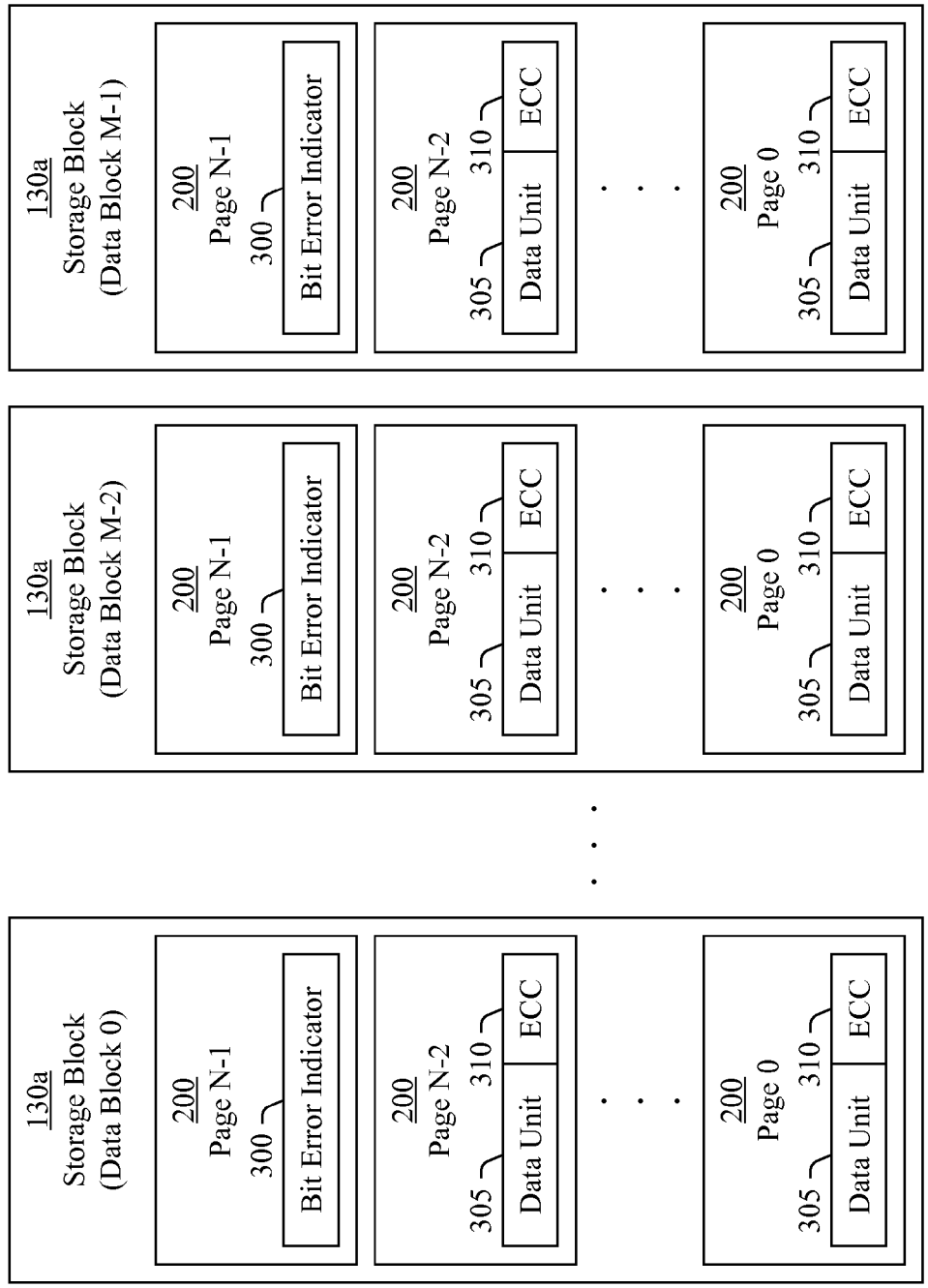
FIG. 3 is a block diagram of a data storage module, in accordance with an embodiment of the present invention.

FIG. 3 illustrates the data storage module 115, in accordance with an embodiment of the present invention. The data storage module 115 includes a number of data storage blocks 130*a*. Each of the data storage blocks 130*a* is identified by a data block storage number in a sequence of data block storage numbers from 0 through M−1. Each of the storage blocks 130 has N memory pages 200, each of which is identified by a memory page number in a sequence of memory page numbers from 0 through N−1.

As illustrated in FIG. 3, each of the memory pages 200 in a data storage block 130*a* has a storage capacity for storing one or more bit error indicators 300 or for storing both a data unit 305 and an error correction code 310 for the data unit 305. In various embodiments, one or more of the memory pages 200 in a given storage block 130*a* are designated (e.g., selected) for storing bit error indicators 300 and other memory pages 200 in a given storage block 130*a* are designated (e.g., selected) for storing data units 305 and error correction codes 310. Moreover, each of the bit error indicators 300 identifies a data location of a data unit 305 as well as bit indexes of data bit errors in the data unit 305. For example, the bit error indicator 300 may identify the memory page 200 containing the data unit 305 as well as bit indexes of data bit errors in the memory page 200.

Figure 4:
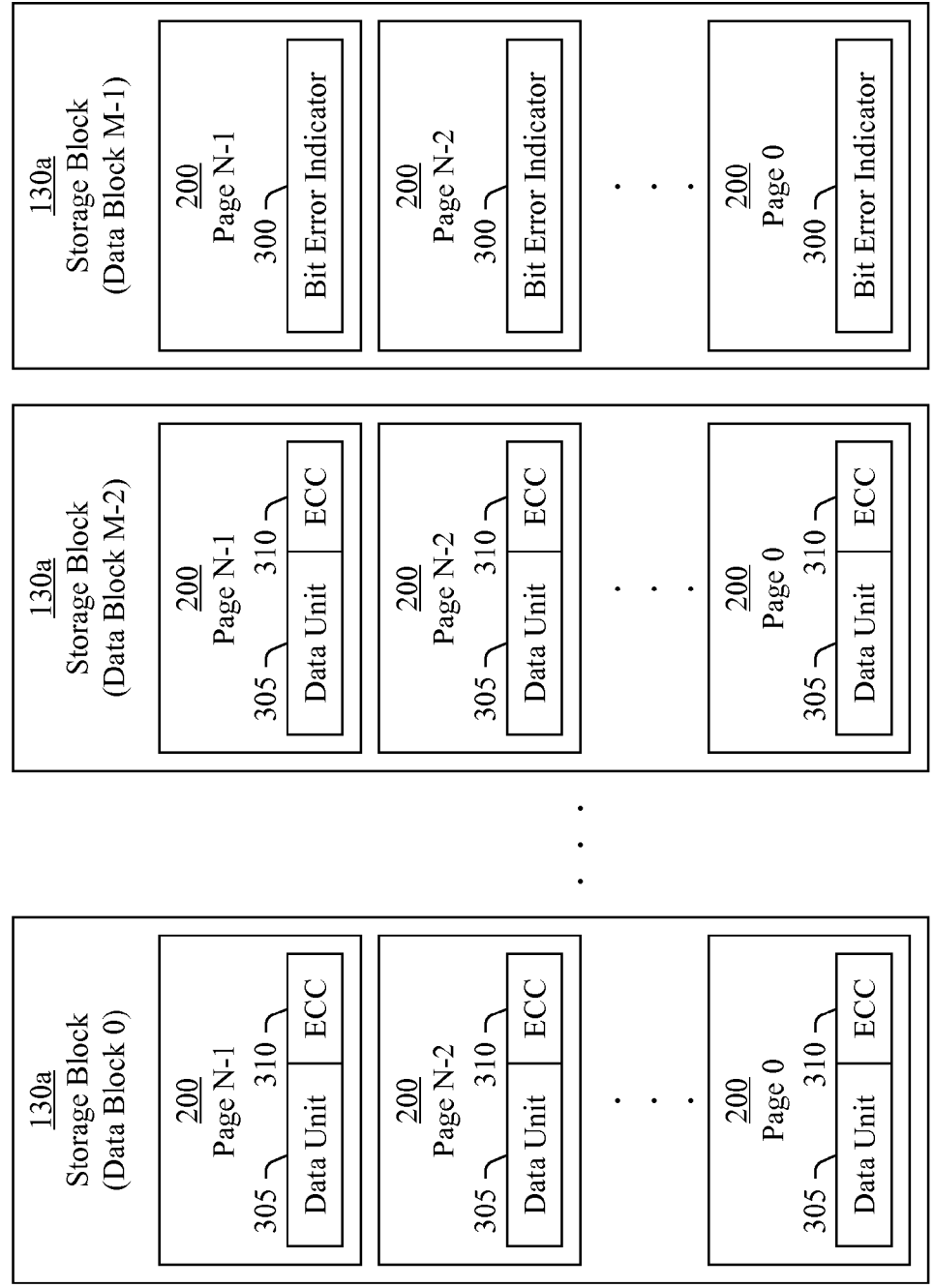
FIG. 4 is a block diagram of a data storage module, in accordance with an embodiment of the present invention.

FIG. 4 illustrates the data storage module 115, in accordance with an embodiment of the present invention. The data storage module 115 includes a number of data storage blocks 130*a*. Each of the data storage blocks 130*a* is identified by a data block storage number in a sequence of data block storage numbers from 0 through M−1. Each of the storage blocks 130 has N memory pages 200, each of which is identified by a memory page number in a sequence of memory page numbers from 0 through N−1.

As illustrated in FIG. 4, each of the memory pages 200 in a data storage block 130*a* has a storage capacity for storing one or more bit error indicators 300 or for storing both a data unit 305 and an error correction code 310 for the data unit 305. In various embodiments, the memory pages 200 in some of the storage blocks 130*a* are designated (e.g., selected) for storing data units 305 and error correction codes 310, and the memory pages 200 in one or more other storage blocks 130*a* are designated (e.g., selected) for storing bit error indicators 300. Moreover, each of the bit error indicators 300 identifies a data location of a data unit 305 as well as bit indexes of data bit errors in the data unit 305. For example, the bit error indicator 300 may identify both the storage block 130*a* and the memory page 200 containing the data unit 305 as well as bit indexes of data bit errors in the memory page 200.

Figure 5:
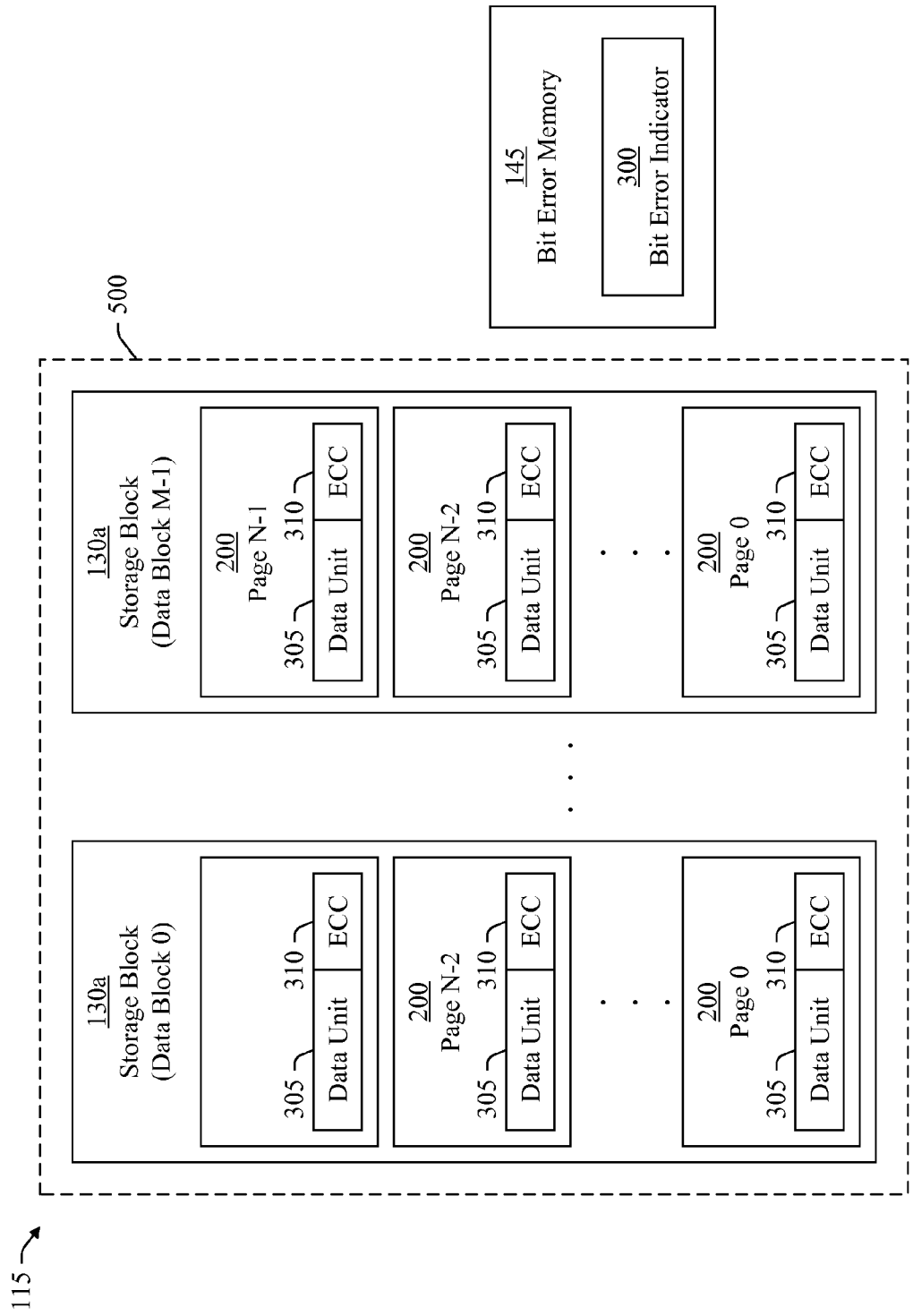
FIG. 5 is a block diagram of a data storage module, in accordance with an embodiment of the present invention.

FIG. 5 illustrates the data storage module 115, in accordance with an embodiment of the present invention. The data storage module 115 includes a number of data storage blocks 130*a*. Each of the data storage blocks 130*a* is identified by a data block storage number in a sequence of data block storage numbers from 0 through M−1. Each of the storage blocks 130 has N memory pages 200, each of which is identified by a memory page number in a sequence of memory page numbers from 0 through N−1.

As illustrated in FIG. 5, each of the memory pages 200 in a data storage block 130*a* has a storage capacity for storing both a data unit 305 and an error correction code 310 for the data unit 305. The bit error memory 155 has a storage capacity for storing one or more bit error indicators 300. In this embodiment, the bit error memory 155 is separate and distinct from the storage blocks 130*a*. For example, the storage blocks 130*a* may be part of a NAND flash storage 500 and the bit error memory 155 may be a non-volatile memory separate and distinct from the flash storage 500. In this embodiment, each of the bit error indicators 300 identifies a data location of a data unit 305 as well as bit indexes of data bit errors in the data unit 305. For example, the bit error indicator 300 may identify both the storage block 130*a* and the memory page 200 containing the data unit 305 as well as bit indexes of data bit errors in the memory page 200.

FIG. 6 illustrates the data unit 305, in accordance with an embodiment of the present invention. The data unit 305 includes a number of data bits 600 each of which is identified by a bit index (i.e., a bit address) in the data unit 305. As illustrated in FIG. 6, the data unit 305 has N bit locations, each of which is identified by a bit index in a sequence of bit identifiers from 0 to N−1. In various embodiments, the bit error indicator 300 identifies one or more data bit errors in a data unit 305 by identifying each bit index of the data bit error in the data unit 305. For example, the bit error indicator 300 may include the bit index of each data bit error in the data unit 305.

FIG. 7 illustrates the data unit 305, in accordance with an embodiment of the present invention. The data unit 305 includes a number of data segments 700, each of which is located at a segment location in the data unit 305. Each of the data segments 700 includes a number of data bits 600. In various embodiments, the data segment 700 may include any number of data bits 600. For example, the data segment 700 may be a data byte including eight data bits 600, a data word including sixteen data bits 600, or a double data word including thirty-two data bits 600.

As illustrated in FIG. 7, the data unit 305 has M data segments 700, each of which is identified by a data segment identifier in a sequence of data segment identifiers from 0 to M−1. Moreover, each of the data segments 700 has N bit locations, each of which is identified by a bit index in a sequence of bit indexes form 0 to N−1. In various embodiments, the bit error indicator 300 identifies one or more bit errors in a data unit 305 by identifying the data segment location of each data segment 700 containing a data bit error as well as the bit indexes of each data bit error in the data segment 700. For example, the bit error indicator 300 may include the data segment identifier of a data segment 700 including a data bit error as well as the bit index of each data bit error in the data segment 700.

Figure 8:
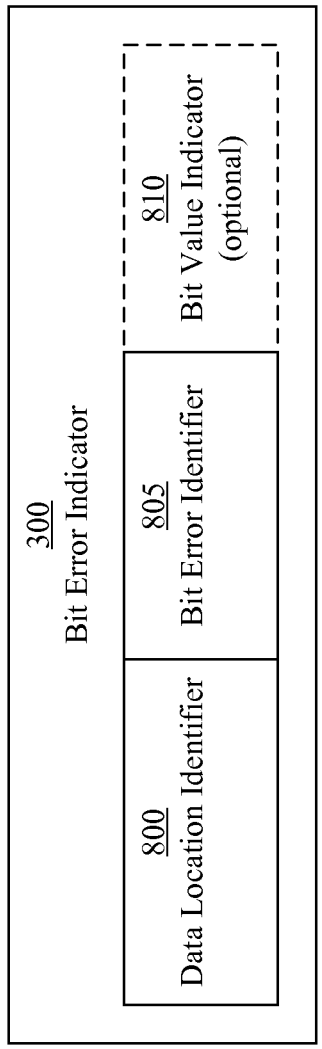
FIG. 8 is a block diagram of a bit error indicator, in accordance with an embodiment of the present invention.

FIG. 8 illustrates the bit error indicator 300, in accordance with an embodiment of the present invention. In this embodiment, the bit error indicator 300 includes a data location identifier 800, a bit error identifier 805, and an optional bit value indicator 810. The data location identifier 800 identifies a location of data containing a data bit error in the data storage module 115. For example, the data location identifier 800 may identify a data unit 305 containing a data bit error or a data segment 700 containing a data bit error, or both. The bit error identifier 805 identifies a bit index of each data bit error in the data. For example, the bit error identifier 805 may identify a bit index of a data bit error in a data unit 305 or a bit index of a data bit error in a data segment 700. The bit value indicator 810 indicates a correct bit value for a data bit 600 in a data unit 305.

In various embodiments, a bit error indicator 300 identifies more than one data bit error in a data unit 300. In these embodiments, the bit error indicator 300 includes more than one bit error identifier 805. In further embodiments, the bit error indicator 300 may include more than one bit value indicator 810. For example, the bit error indicator 300 may include a bit value indicator 810 for each bit error indicator 300 in the bit error indicator 300.

In some embodiments, the bit error indicator 300 includes more than one data location identifier 800, each of which identifies a location of the data unit 300 associated with the bit error indicator 300. For example, a portion of the bit error indicator 300 including one of the data location identifiers 805 and a bit error identifier 300 may be stored in a portion of a memory page 200 and another portion of the bit error indicator 300 including another data location identifier 805 and another bit error identifier 300 may be stored in another portion of the memory page 200 or in another memory page 200.

In operation, the bit error indicator generator 125 selects a portion of a memory page 200 that has not been programmed since the last erase operation was performed on the storage block 130 containing the memory page 200. The bit error indicator generator 125 updates the bit error indicator 300 by generating a data location identifier 805 and a bit error identifier 300, and storing the data location identifier 805 and bit error identifier 810 into the selected portion of the memory page 200. In this way, the data storage controller 115 need not perform a program-erase cycle on the storage block 130 to update the bit error indicator 300. In further embodiments, the bit error indicator generator 125 updates the bit error indicator 300 by generating a bit value indicator 810 and storing the bit value indicator 810 into the selected portion of the memory page 200 along with the data location identifier 805 and the bit error identifier 810. In various embodiments, portions of the bit error indicator 300 may be stored among multiple memory pages 200, which may be distributed among multiple storage blocks 130.

In various embodiments, the bit error indictor generator 125 and the bit manipulation module 135 identify bit error indicators 300 associated with a data unit 305 based on the data location identifier 800 of the bit error indicator 300. For example, the bit error indictor generator 125 and the bit manipulation module 135 may search for a bit error indicator 300 associated with a data unit 305 by identifying a data location of the data unit 305 in the bit error memory 155 (e.g., a memory page 200).

Figure 9:
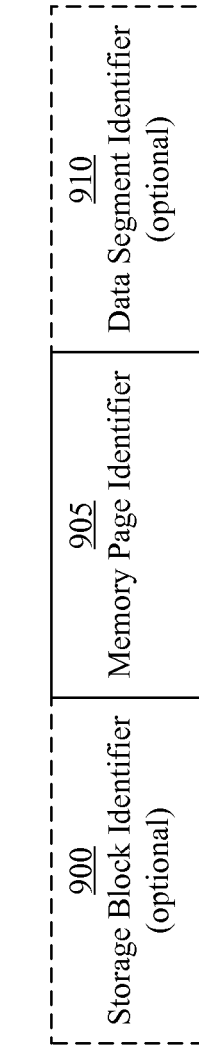
FIG. 9 is a block diagram of a bit index identifier, in accordance with an embodiment of the present invention.

FIG. 9 illustrates the data location identifier 800, in accordance with an embodiment of the present invention. The data location identifier 800 includes a memory page identifier 905 identifier for identifying a memory page 200 containing a data unit 305 having one or more data bit errors. For example, the memory page identifier 905 may be a memory address of the memory page 200 containing the data unit 305. In some embodiments, the data location identifier 800 includes an optional storage block identifier 900 identifying the storage block 130 which includes the memory page 200 containing the data unit 305. For example, the storage block identifier 900 may be a storage block number of the storage block 130. In some embodiments, the data location identifier 800 includes an optional data segment identifier 910. For example, the data segment identifier 910 may identify a data segment 700 in a data unit 305 by identifying the data segment location of the data segment 700 in the data unit 305.

In one embodiment, the data location identifier 800 includes the memory page identifier 905 and the data segment identifier 910 but does not include the storage block identifier 900. In this embodiment, the bit error indicators 300 for memory pages 200 of a given storage block 130 are stored in a memory page 200 of the storage block 130, as is illustrated in FIG. 3. For example, a storage block 130 may includes one-hundred twenty-eight memory pages 200 and a data unit 305 may include four-thousand ninety-six data bytes 600. In this example, the memory page identifier 905 includes seven data bits for identifying a memory page 200 containing the data unit 305, and the data segment identifier 910 includes twelve data bits for identifying a data byte in the data unit 305. The bit error identifier 805 of the bit error indicator 300 includes three data bits for identifying a data bit 600 in the data byte that is a data bit error in the data unit 305. The bit value indicator 810 includes one data bit for indicating a correct bit value for the data bit 600 in the data byte identified by the bit error indicator 300.

Figure 10:
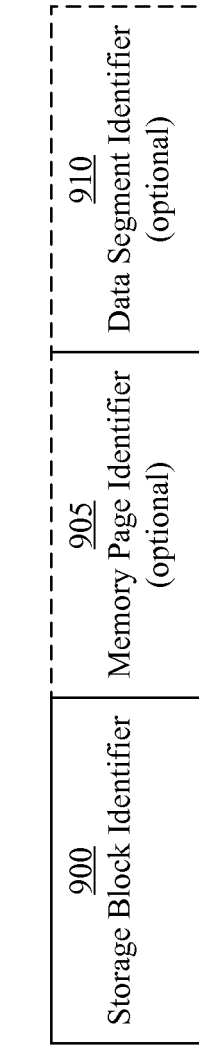
FIG. 10 is a block diagram of a bit error identifier, in accordance with an embodiment of the present invention.

FIG. 10 illustrates the data location identifier 800, in accordance with an embodiment of the present invention. The data location identifier 800 includes a storage block identifier 900 identifier for identifying a memory page 200 containing a data unit 305 having one or more data bit errors. For example, the storage block identifier 900 may be a storage block number of the storage block 130. In some embodiments, the data location identifier 800 includes an optional memory page identifier 905 identifying the memory page 200 containing the data unit 305. For example, the memory page identifier 905 may be a memory address of the memory page 200 containing the data unit 305. In some embodiments, the data location identifier 800 includes an optional data segment identifier 910. For example, the data segment identifier 910 may identify a data segment 700 in a data unit 305 by identifying the data segment location of the data segment 700 in the data unit 305.

In some embodiments, the data location identifier 800 includes the storage block identifier 900 and the data segment identifier 910 but does not include the memory page identifier 905. In this embodiment, the bit error indicators 300 for memory pages 200 having a same memory page number in a number of storage blocks 130 are stored in a corresponding memory page 200 of another storage block 130, as is illustrated in FIG. 4.

For example, a data storage module 115 may include one-hundred twenty-eight storage blocks 130 and a data unit 305 may include four-thousand ninety-six data bytes 600. In this example, the storage block identifier 900 includes seven data bits for identifying a storage block 130 containing the data unit 305, and the data segment identifier 910 includes twelve data bits for identifying a data byte in the data unit 305. The bit error identifier 805 of the bit error indicator 300 includes three data bits for identifying a data bit 600 in the data byte that is a data bit error in the data unit 305. The bit value indicator 810 includes one data bit for indicating a correct bit value for the data bit 600 in the data byte identified by the bit error indicator 300.

In one embodiment, the memory page 200 including the bit error indicators 300 has the same memory page number as the memory pages 200 in the storage blocks 130 identified by the bit error indicators 300. In this way, the bit error indicators 300 and the data units 305 associated with the bit error indicators 300 are distributed among memory pages 200 in the data storage system 105 in a homogeneous organization. In another embodiment, the memory page 200 including the bit error indicators 300 has a different memory page number than the memory pages 200 in the storage blocks 130 identified by the bit error indicators 300. In this way, the bit error indicators 300 and the data units 305 associated with the bit error indicators 300 are distributed among memory pages 200 in the data storage system 105 in a heterogeneous organization. In embodiments in which bit-error rates of the memory pages 200 are correlated to the memory page numbers of the memory pages 200, data integrity is improved in the heterogeneous organization in comparison to the homogeneous organization.

In some embodiments, the error correction module 145 generates an error correction code 310 for one or more bit error indicators 300 and writes (i.e., stores) the error correction code 310 for the bit error indicators 300 into the bit error memory 155. Further, the error correction module 145 detects and corrects data bit errors in bit error indicators 300 read from the bit error memory 155 based on the error correction code 30 before using the bit error indicators 300 to modify data bits 600 in a data unit 305.

In some embodiments, the bit error indicator generator 125 stores one or more bit error indicators 300 into a memory page 200 of a storage block 130 as a data unit 305 along with the error correction code 310 for the data unit 305. Further, the bit error indicator generator 125 generates an additional bit error indicator 300 for the data unit 305 and the bit manipulation module 135 corrects data bit errors in the data unit 305 based on this additional bit error indicator 300. In this way, the bit manipulation module 135 corrects data bit errors in bit error indicators 300 a recursive manner, which further increases data integrity in the data storage system 105.

Figure 11:
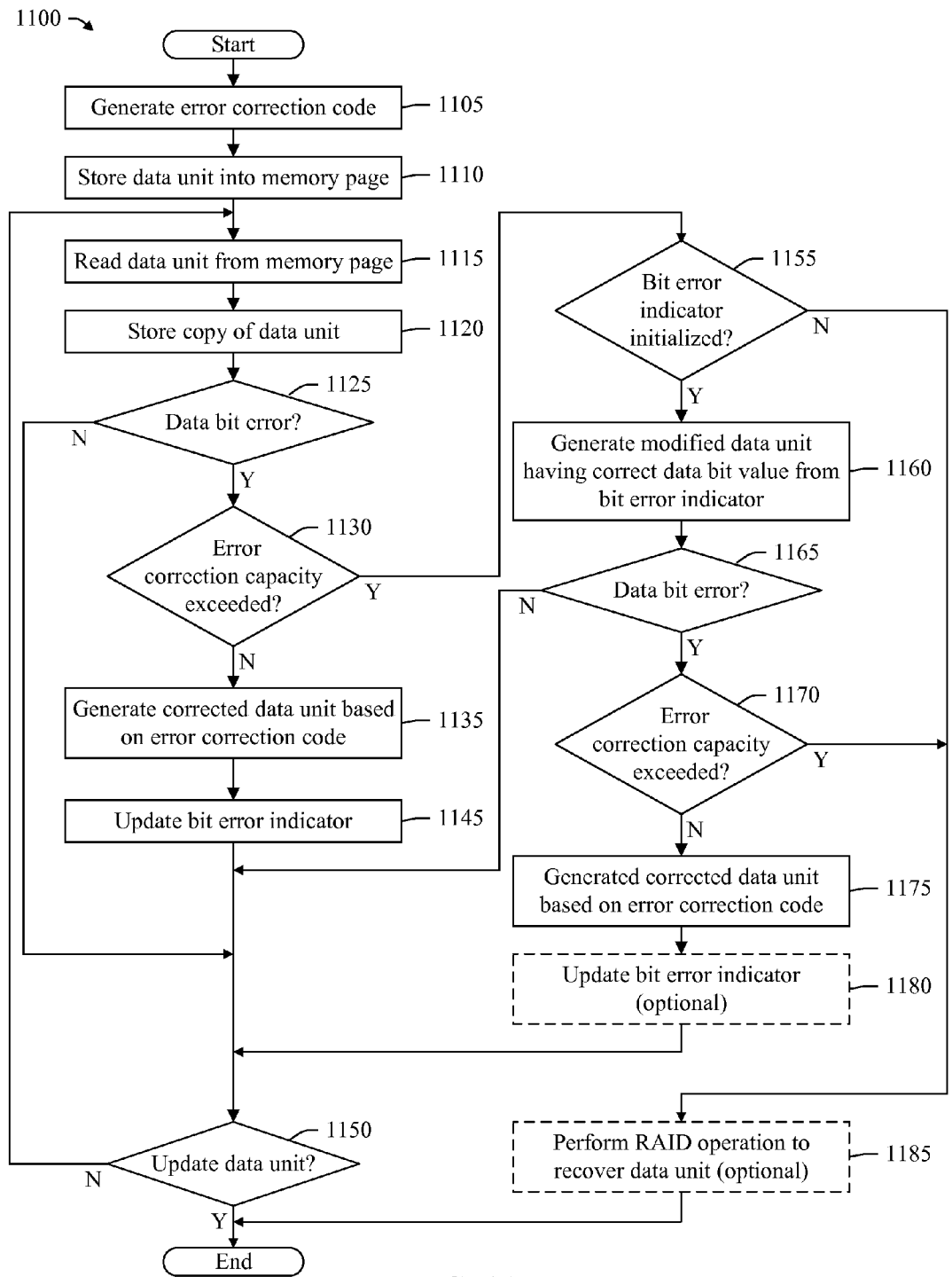
FIG. 11 is a flow chart for a method of correcting data bit errors in a data unit, in accordance with an embodiment of the present invention.

FIG. 11 illustrates a method 1100 of correcting data bit errors in a data unit, in accordance with an embodiment of the present invention. In step 1105, an error correction code is generated for a data unit. In various embodiments, the data storage system 105 receives a data unit 305 and generates an error correction code 310 for the data unit 305. For example, the data storage controller 110 of the data storage system 105 may receive the data unit 305 from the host processor 140, generate the error correction code 310 for the data unit 305, and store the error correction code 310 into a memory page 200 of the data storage module 115. The method 1100 then proceeds to step 1110.

In step 1110, the data unit is stored into a memory page. In various embodiments, the data storage controller 110 stores the data unit 305 into a memory page 200 of a storage block 130 in the data storage module 115. For example, the data storage module 115 may include a NAND flash storage having storage blocks 130 including memory pages 200. In this example, the data storage controller 110 stores the data unit 305 into a memory page 200 of a storage block 130 in the NAND flash storage by selectively programming data bits 600 in the memory page 200. In this process, the data storage controller 110 selectively modifies data bits 600 from an erased bit value (e.g., a logic value of one) to a programmed bit value (e.g., a logic value of zero) in the memory page 200. The method 1100 then proceeds to step 1115.

In step 1115, the data unit is read from the memory page. In various embodiments, the data storage controller 110 reads the data unit 305 from the memory page 200 containing the data unit 305 in the data storage module 115. For example, the data storage module 115 may include a NAND flash storage having storage blocks 130 including memory pages 200. In this example, the data storage controller 110 reads the data unit 305 from the memory page 200 containing the data unit 305 in the NAND flash storage. The method 1100 then proceeds to step 1120.

In step 1120, a copy of the data unit is stored. In various embodiments, the data storage controller 110 stores a copy of the data unit, for example in a data register of the data storage controller 110. The method 1100 then proceeds to step 1125.

In step 1125, a determination is made as to whether the data unit has a data bit error. In various embodiments, the data storage controller 110 determines whether the data unit 305 read from the memory page 200 has a data bit error based on the error correction code 310 for the data unit 305. For example, the error correction module 145 may detect a number of data bit errors in the data unit 305 based on the error correction code 310 for the data unit 305. If the data unit 305 has one or more data bit errors, the method 1100 proceeds to step 1130. Otherwise, the method 1100 proceeds to step 1150.

In step 1130, arrived at from the determination in step 1125 that the data unit has a data bit error, a determination is made as to whether the number of data bit errors in the data unit exceeds an error correction capacity of the error correction code. In various embodiments, the data storage controller 110 determines whether the number of data bit errors in the data unit 305 read from the memory page 200 of the storage block 130 exceeds an error correction capacity of the error correction code 310 for the data unit 305. If the number of data bit errors in the data unit 305 exceeds the error correction capacity of the error correction code 310 for the data unit 305, the method 1100 proceeds to step 1155. Otherwise, the method 1100 proceeds to step 1135.

In step 1135, arrived at from the determination in step 1130 that the number of data bit errors in the data unit does not exceed the error correction capacity of the error correction code for the data unit, a corrected data unit is generated based on the error correction code. In various embodiments, the data storage controller 110 generates a corrected data unit 305 by correcting the data bit errors in the data unit 305 the copy of the data unit 305 based on the error correction code 310 for the data unit 305. For example, the error correction module 145 of the data storage controller 110 may correct the number of data bit errors in the data unit 305 stored in the data storage controller 110 based on the error correction code 310 for the data unit 305. The method 1100 then proceeds to step 1145.

In step 1145, the bit error indicator is updated. In various embodiments, the data storage controller 110 updates the bit error indicator 300 of the data unit 305. In some embodiments, the bit error indicator generator 125 of the data storage controller 110 identifies a data bit 600 having a data bit error in the data unit 305, based on the error correction code 310 of the data unit 305, and determines the correct bit value of the data bit 600. For example, the bit error indicator generator 125 may determine the correct data bit value of the data bit 600 by logically negating the data bit 600. If the bit error indicator 300 is not initialized, the bit error indicator 125 generates the bit error indicator 300 including the bit index of the data bit 600 and the correct bit value of the data bit 600. In this way, the bit error indicator generator 125 updates the bit error indicator 300 of the data unit 305 by initializing the bit error indicator 300.

If the bit error indicator 300 is initialized but does not identify the bit index of the data bit 600, the bit error indicator generator 125 adds the bit index of the data bit 600 and the correct bit value of the data bit 600 to the bit error indicator 300. In this way, the bit error indicator generator 125 updates the bit error indicator 300 to include the bit index of the data bit 600 having the data bit error and the correct bit value of the data bit 600. In various embodiments, the data storage controller 110 updates the bit error indicator 300 without performing a program-erase cycle on a storage block 130 of the data storage module 115, for example by programming data bits in bit error memory 155 from the erased bit value to the programmed bit value. The method 1100 then proceeds to step 1150.

In step 1150, arrived at from the determination in step 1125 that the data unit does not contain a data bit error, or step 1145 in which the bit error indicator is updated, the determination in step 1165 that the modified data unit does not have a data bit error, or step 1180 in which the bit error indicator is updated, a determination is made as to whether the data unit is to be updated. In various embodiments, the data storage controller 110 determines whether the data unit 305 is to be updated. The data storage controller 110 updates the data unit 305 by modifying or moving the data unit 305 in the data storage module 115. As a result, data bit errors caused by a read disturbance of a memory page 200 containing a data unit 305 are invalidated For example, the data storage controller 110 may update the data unit 305 by modifying the data value of the data unit 305 in a program-erase cycle. As another example, the data storage controller 110 may update the data unit 305 by moving the data unit 305 to another memory page 200. If the data unit 305 is not to be updated, the method 1100 returns to step 1115 in which another read operation is performed on the data unit 305. Otherwise, the method 1100 ends.

In step 1155, arrived at from the determination in step 1130 that the error correction capacity of the error correction code is exceeded, a determination is made as to whether a bit error indicator is initialized. In various embodiments, the data storage controller 110 determines whether a bit error indicator 300 is initialized for the data unit 305. For example, the bit error indicator generator 125 may maintain a flag indicating whether a bit error indicator 300 corresponding to the memory page 200 containing the data unit 305 is initialized. If the bit error indicator 300 is not initialized for the data unit 305, the method 1100 proceeds to optional step 1185. Otherwise, the method 1100 proceeds to step 1160.

In step 1160, arrived at from the determination in step 1155 that the bit error indicator is initialized, a modified data unit is generated having a correct bit value from the bit error indicator of the data unit. In various embodiments, the data storage controller 110 generates the modified data unit 305 by negating the logic value of one or more data bits 600 in the copy of the data unit 305 at each bit index identified by the bit error indicator 300 for the data unit 305. In some embodiments, the bit manipulation module 135 of the data storage controller 110 modifies data bits 600 in the copy of the data unit 305 by setting each data bit 600 identified by the bit error indicator 300 to a correct bit value as indicated in the bit error indicator 300. The method 1100 then proceeds to step 1165.

In step 1165, a determination is made as to whether the modified data unit has a data bit error. In various embodiments, the data storage controller 110 determines whether the modified data unit 305 read from the memory page 200 has a data bit error based on the error correction code 310 for the data unit 305. For example, the error correction module 145 may detect a number of data bit errors in the modified data unit 305 based on the error correction code 310 for the data unit 305. If the modified data unit 305 has one or more data bit errors, the method 1100 proceeds to step 1170. Otherwise, the method 1100 proceeds to step 1150.

In step 1170, arrived at from the determination in step 1165 that the modified data unit has a data bit error, a determination is made as to whether the number of data bit errors in the modified data unit exceeds an error correction capacity of the error correction code. In various embodiments, the data storage controller 110 determines whether the number of data bit errors in the modified data unit 305 exceeds an error correction capacity of the error correction code 310 for the data unit 305. If the number of data bit errors in the modified data unit 305 exceeds the error correction capacity of the error correction code 310 for the data unit 305, the method 1100 proceeds to optional step 1185. Otherwise, the method 1100 proceeds to step 1175.

In step 1175, arrived at from the determination in step 1170 that the number of data bit errors in the modified data unit does not exceed the error correction capacity of the error correction code for the data unit, a corrected data unit is generated based on the error correction code. In various embodiments, the data storage controller 110 generates a corrected data unit 305 by correcting the data bit errors in the modified data unit 305 based on the error correction code 310 for the data unit 305. For example, the error correction module 145 of the data storage controller 110 may correct the number of data bit errors in the modified data unit 305 based on the error correction code 310 for the data unit 305. The method 1100 then proceeds to optional step 1180.

In optional step 1180, the bit error indicator is updated. In various embodiments, the data storage controller 110 updates the bit error indicator 300 of the data unit 305. In some embodiments, the bit error indicator generator 125 of the data storage controller 110 identifies a data bit 600 having a data bit error in the data unit 305, based on the error correction code 310 of the data unit 305, and determines the correct bit value of the data bit 600. For example, the bit error indicator generator 125 may determine the correct data bit value of the data bit 600 by logically negating the data bit 600. The bit error indicator generator 125 adds the bit index of the data bit 600 and the correct bit value of the data bit 600 to the bit error indicator 300. In this way, the bit error indicator generator 125 updates the bit error indicator 300 to include the bit index of the data bit 600 having the data bit error and the correct bit value of the data bit 600. In various embodiments, the data storage controller 110 updates the bit error indicator 300 without performing a program-erase cycle on a storage block 130 of the data storage module 115, for example by programming data bits in bit error memory 155 from the erased bit value to the programmed bit value.

In some embodiments, the data storage controller 110 remaps a storage block 130 containing bit error indicators 300 when a predetermined error threshold is reached. In one embodiment, the error threshold is reached when the number of data bit errors occurring in the storage block 130 reaches a fixed number. In another embodiment, the error threshold is reached when a storage capacity of the storage block 130 for storing bit error indicators 300 is reached. In still another embodiment, the error threshold is reached when the number of data bit errors occurring in a memory page 200 of the storage block 130 reaches a fixed number. In yet another embodiment, the error threshold is reached when the number of data bit errors occurring in a memory page 200 of the storage block 130 is substantially close to the error correction capacity of the error correction code 310 for the bit error indicators 300 stored in the memory page 200. For example, the number of data bit errors may be one or two less than the error correction capacity of the error correction code 310. In various embodiments, the data storage controller 110 remaps the storage block 130 by performing a program-erase cycle on the storage block 130 or by moving the bit error indicators 300 in the storage block 130 to another storage block 130. The method 1100 then proceeds to step 1150.

In optional step 1185, arrived at from the determination in step 1155 that a bit error indicator is not initialized or the determination in step 1170 that the error correction capacity of the error correction code is exceeded, a RAID recovery operation is performed on the data unit. In various embodiments, the data storage controller 110 performs the RAID recovery operation on the data unit 305. For example, the data recovery module 150 of the data storage controller 110 may perform the RAID recovery operation. The method 1100 then ends.

In various embodiments, the method 1100 illustrated in FIG. 11 may include more or fewer than the steps 1105-1185 illustrated in FIG. 11 and described above. In some embodiments, the steps 1105-1185 of the method 1100 illustrated in FIG. 11 may be performed in a different order than the order illustrated in FIG. 11 and described above. In some embodiments, some of the steps 1105-1185 of the method 1100 illustrated in FIG. 11 may be performed in parallel or substantially simultaneously. In various embodiments, one or more of the steps 1105-1185 may be performed more than once in the method 1100 illustrated in FIG. 11.

Figure 12:
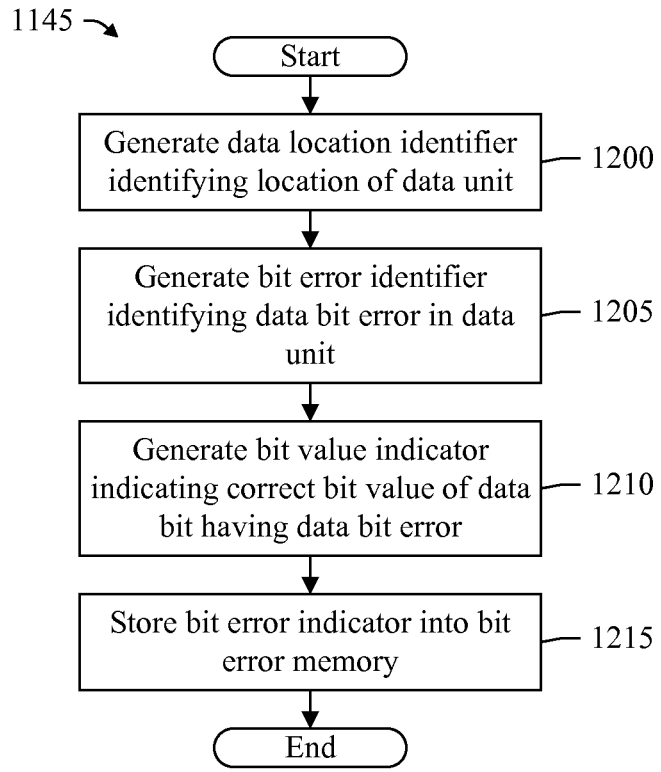
FIG. 12 is a flow chart for a portion of a method of correcting data bit errors in a data unit, in accordance with an embodiment of the present invention.

FIG. 12 illustrates a portion of the method 1100 of correcting a data bit errors in a data unit, in accordance with an embodiment of the present invention. The portion of the method illustrated in FIG. 12 includes embodiments of the step 1145 of the method 1100 for initialization the bit error indicator.

In step 1200, a data location identifier is generated for identifying a location of the data unit having the data bit error. In various embodiments, the bit error indicator 1125 generates a data location identifier 800 for identifying a memory page 200 or a storage block 130, or both, as a location of the data unit 305. The portion of the method 1100 then proceeds to step 1205.

In step 1205, a bit error identifier is generated for identifying data bit errors in the data unit. In various embodiments, the bit error indicator 1125 generates a bit error identifier 805 of the bit error indicator 300 by identifying bit indexes of data bit errors in the data unit 305. For example, the bit error indicator 1125 may identify a bit index of a data bit error in the data unit 305 based on the error correction code 310 for the data unit 305. The portion of the method 1100 then proceeds to step 1210.

In step 1210, bit value indicators are generated for indicating correct bit values of the data bit errors. In various embodiments, the bit error indicator generator 125 generates a bit value indicator 810 for each data bit error identified by a respective bit index in the bit error identifier 805. Moreover, the bit value indicator 810 indicates a correct bit value for the data bit error identified by the respective bit index. The portion of the method 1100 then proceeds to step 1215.

In step 1215, the bit error indicator is stored into the bit error memory. In various embodiments, the bit error indicator generator 125 stores the bit error indicator 305 into the bit error memory 155. For example, the bit error memory 155 may include a memory page 200 of a storage block 130 in the data storage module 115. In this example, the bit error indicator 125 stores the bit error indicator 305 into the memory page 200 of the bit error memory 155. In one embodiment, the bit error indicator 125 is stored by negating data bits in bit error memory 155. Accordingly, the storage of the bit error indicator 125 does not require a program-erase cycle. The portion of the method 1100 then ends.

Figure 13:
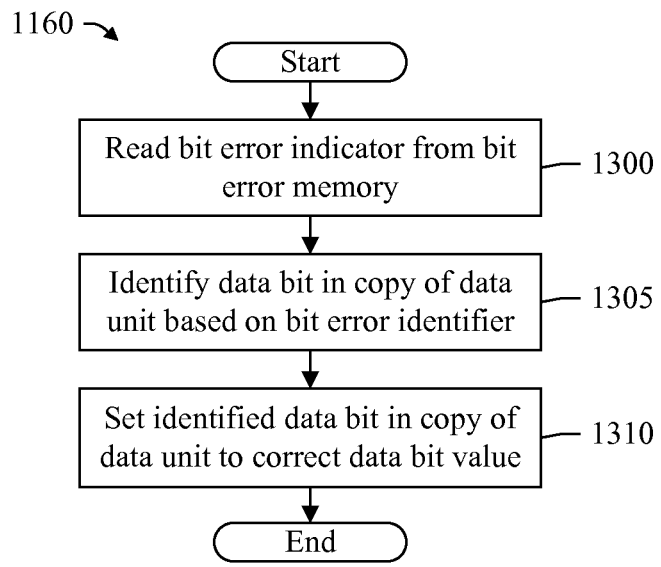
FIG. 13 is a flow chart for a portion of a method of correcting data bit errors in a data unit, in accordance with an embodiment of the present invention.

FIG. 13 illustrates a portion of the method 1100 of correcting a data bit errors in a data unit, in accordance with an embodiment of the present invention. The portion of the method illustrated in FIG. 13 includes embodiments of the step 1160 of the method 1100 for generating a modified data unit. In step 1300, the bit error indicator associated with the data unit is read from the bit error memory. In various embodiments, the bit manipulation module 135 reads the bit error indicator 305 associated with the data unit 305 from the bit error memory 155. For example, the bit manipulation module 135 may identify the bit error indicator 305 associated with the data unit 305 based on the data location identifier 800 in the bit error indicator 305 and read the identified bit error indicator 305 from the bit error memory 155. The portion of the method 1100 then proceeds to step 1305.

In step 1305, a data bit is identified in the copy of the data unit based on the bit error indicator. In various embodiments, the bit manipulation module 135 identifies one or more data bits 600 in the copy of the data unit 305 based on the bit error indicator 300 of the data unit 305. For example, the bit manipulation module 135 may identify a data bit 600 in the copy of the data unit 305 based on a bit index in the bit error indicator 300. The portion of the method 1100 then proceeds to step 1310.

In step 1310, the identified data bits in the copy of the data unit are set to the correct bit values of data bits. In various embodiments, the bit manipulation module 135 sets each of the data bits 600 identified in the copy of the data unit 305 to the correct bit value of the data bit 600 indicated in the bit error indicator 300. In this way, the bit manipulation module 135 corrects each of the identified data bits 600 that is an erroneous data bit in the copy of the data unit 305. The portion of the method 1100 then ends.

Figure 14:
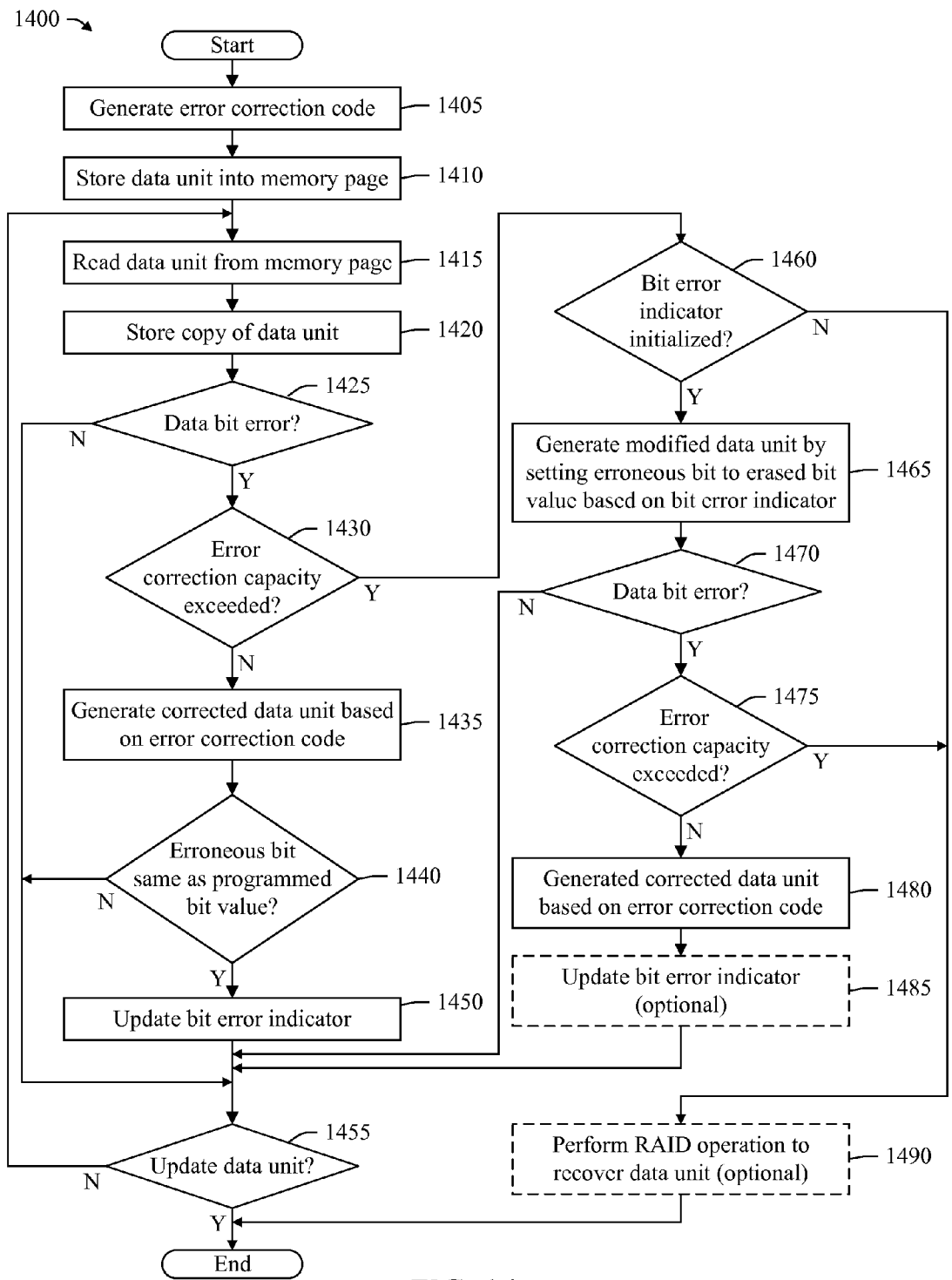
FIG. 14 is a flow chart for a method of correcting data bit errors in a data unit, in accordance with an embodiment of the present invention.

FIG. 14 illustrates a method 1400 of correcting data bit errors in a data unit, in accordance with an embodiment of the present invention. In this embodiment, the method 1400 uses a bit error indicator 300 to correct data bits that have been inadvertently changed from an erased bit value (i.e., a predetermined bit value) to a programmed bit value in a data unit 305. For example, a read disturbance of a memory page 200 containing a data unit 305 may cause a data bit 600 in a data unit 305 to inadvertently change from an erased bit value, which is a correct bit value for the data bit 600, to a programmed bit value, which is an erroneous bit value for the data bit 600.

In step 1405, an error correction code is generated for a data unit. In various embodiments, the data storage system 105 receives a data unit 305 and generates an error correction code 310 for the data unit 305. For example, the data storage controller 110 of the data storage system 105 may receive the data unit 305 from the host processor 140, generate the error correction code 310 for the data unit 305, and store the error correction code 310 into a memory page 200 of the data storage module 115. The method 1400 then proceeds to step 1410.

In step 1410, the data unit is stored into a memory page. In various embodiments, the data storage controller 110 stores the data unit 305 into a memory page 200 of a storage block 130 in the data storage module 115. For example, the data storage module 115 may include a NAND flash storage having storage blocks 130 including memory pages 200. In this example, the data storage controller 110 stores the data unit 305 into a memory page 200 of a storage block 130 in the NAND flash storage by selectively programming data bits 600 in the memory page 200. In this process, the data storage controller 110 selectively modifies data bits 600 from an erased bit value (e.g., a logic value of one) to a programmed bit value (e.g., a logic value of zero) in the memory page 200. The method 1400 then proceeds to step 1415.

In step 1415, the data unit is read from the memory page. In various embodiments, the data storage controller 110 reads the data unit 305 from the memory page 200 containing the data unit 305 in the data storage module 115. For example, the data storage module 115 may include a NAND flash storage having storage blocks 130 including memory pages 200. In this example, the data storage controller 110 reads the data unit 305 from the memory page 200 containing the data unit 305 in the NAND flash storage. The method 1400 then proceeds to step 1420.

In step 1420, a copy of the data unit is stored. In various embodiments, the data storage controller 110 stores a copy of the data unit in a temporary storage location, for example in a data register of the data storage controller 110. The method 1400 then proceeds to step 1425.

In step 1425, a determination is made as to whether the data unit has a data bit error. In various embodiments, the data storage controller 110 determines whether the data unit 305 read from the memory page 200 has a data bit error based on the error correction code 310 for the data unit 305. For example, the error correction module 145 may detect a number of data bit errors in the data unit 305 based on the error correction code 310 for the data unit 305. If the data unit 305 has one or more data bit errors, the method 1400 proceeds to step 1430. Otherwise, the method 1400 proceeds to step 1455.

In step 1430, arrived at from the determination in step 1425 that the data unit has a data bit error, a determination is made as to whether the number of data bit errors in the data unit exceeds an error correction capacity of the error correction code. In various embodiments, the data storage controller 110 determines whether the number of data bit errors in the data unit 305 read from the memory page 200 of the storage block 130 exceeds an error correction capacity of the error correction code 310 for the data unit 305. If the number of data bit errors in the data unit 305 exceeds the error correction capacity of the error correction code 310 for the data unit 305, the method 1400 proceeds to step 1460. Otherwise, the method 1400 proceeds to step 1435.

In step 1435, arrived at from the determination in step 1430 that the number of data bit errors in the data unit does not exceed the error correction capacity of the error correction code for the data unit, a corrected data unit is generated based on the error correction code. In various embodiments, the data storage controller 110 generates a corrected data unit 305 by correcting the data bit errors in the data unit 305 the copy of the data unit 305 based on the error correction code 310 for the data unit 305. For example, the error correction module 145 of the data storage controller 110 may correct the number of data bit errors in the data unit 305 stored in the data storage controller 110 based on the error correction code 310 for the data unit 305. The method 1400 then proceeds to step 1440.

In step 1440, it is determined whether an erroneous data bit in the data unit has the programmed bit value. In various embodiments, the data storage controller 110 determines whether an erroneous data bit in the data unit 305 has the programmed bit value. For example, the bit error indicator generator 125 of the data storage controller 110 may identify each data bit 600 having a data bit error in the data unit 305, based on the error correction code 310 for the data unit 305, and determine whether at least one of the identified data bits 600 has the programmed bit value. If an erroneous data bit in the data unit 305 has the programmed bit value, the method 1400 proceeds to step 1450. Otherwise, the method 1400 proceeds to step 1455.

In step 1450, arrived at from the determination in step 1440 that an erroneous data bit in the data unit has the programmed bit value, the bit error indicator of the data unit is updated. In various embodiments, the data storage controller 110 updates the bit error indicator 300 of the data unit 305. In some embodiments, the bit error indicator generator 125 of the data storage controller 110 identifies each erroneous data bit 600 having the programmed bit value in the data unit 305. If the bit error indicator 300 of the data unit 305 is not initialized, the bit error indicator 125 generates the bit error indicator 300 including the bit index of each identified erroneous data bit 600. In this way, the bit error indicator generator 125 updates the bit error indicator 300 of the data unit 305 by initializing the bit error indicator 300.

If the bit error indicator 300 of the data unit 305 is initialized, the bit error indicator generator 125 adds the bit index of any erroneous data bit 600 having the programmed bit value to the bit error indicator 300 if the bit error indicator 300 does not already include the bit index. In this way, the bit error indicator generator 125 updates the bit error indicator 300 to identify the bit index of the erroneous data bit 600. In various embodiments, the data storage controller 110 updates the bit error indicator 300 without performing a program-erase cycle on a storage block 130 of the data storage module 115, for example by programming data bits in bit error memory 155 from the erased bit value to the programmed bit value. The method 1400 then proceeds to step 1455.

In step 1455, arrived at from the determination in step 1425 that the data unit does not contain a data bit error, step 1450 in which the bit error indicator is updated, the determination in step 1470 that the modified data unit does not have a data bit error, or step 1485 in which the bit error indicator is updated, a determination is made as to whether the data unit is to be updated. In various embodiments, the data storage controller 110 determines whether the data unit 305 is to be updated. The data storage controller 110 updates the data unit 305 by modifying or moving the data unit 305 in the data storage module 115. As a result, data bit errors caused by a read disturbance of a memory page 200 containing a data unit 305 are invalidated.

For example, the data storage controller 110 may update the data unit 305 by modifying the data value of the data unit 305 in a program-erase cycle. As another example, the data storage controller 110 may update the data unit 305 by moving the data unit 305 to another memory page 200. If the data unit 305 is not to be updated, the method 1400 returns to step 1415 in which another read operation is performed on the data unit 305. Otherwise, the method 1400 ends.

In step 1460, arrived at from the determination in step 1430 that the error correction capacity of the error correction code is exceeded, a determination is made as to whether a bit error indicator is initialized. In various embodiments, the data storage controller 110 determines whether a bit error indicator 300 is initialized for the data unit 305. For example, the bit error indicator generator 125 may maintain a flag indicating whether a bit error indicator 300 corresponding to the memory page 200 containing the data unit 305 is initialized. If the bit error indicator 300 is not initialized for the data unit 305, the method 1400 proceeds to optional step 1490. Otherwise, the method 1400 proceeds to step 1465.

In step 1465, arrived at from the determination in step 1460 that the bit error indicator is initialized, a modified data unit is generated by setting an erroneous data bit in the data unit to the erased bit value based on the bit error indicator. In various embodiments, the data storage controller 110 generates the modified data unit 305 by setting one or more data bits 600 in the copy of the data unit 305 to the erased bit value. For example, the bit manipulation module 135 of the data storage controller 110 may set each data bit 600 in the copy of the data unit 205 at a bit index identified in the bit error indicator 300 to the programmed bit value, which is the correct bit value of the data bit 600. The method 1400 then proceeds to step 1470.

In step 1470, a determination is made as to whether the modified data unit has a data bit error. In various embodiments, the data storage controller 110 determines whether the modified data unit 305 read from the memory page 200 has a data bit error based on the error correction code 310 for the data unit 305. For example, the error correction module 145 may detect a number of data bit errors in the modified data unit 305 based on the error correction code 310 for the data unit 305. If the modified data unit 305 has one or more data bit errors, the method 1400 proceeds to step 1475. Otherwise, the method 1400 proceeds to step 1455.

In step 1475, arrived at from the determination in step 1470 that the modified data unit has a data bit error, a determination is made as to whether the number of data bit errors in the modified data unit exceeds an error correction capacity of the error correction code. In various embodiments, the data storage controller 110 determines whether the number of data bit errors in the modified data unit 305 exceeds an error correction capacity of the error correction code 310 for the data unit 305. If the number of data bit errors in the modified data unit 305 exceeds the error correction capacity of the error correction code 310 for the data unit 305, the method 1400 proceeds to optional step 1490. Otherwise, the method 1400 proceeds to step 1480.

In step 1480, arrived at from the determination in step 1475 that the number of data bit errors in the modified data unit does not exceed the error correction capacity of the error correction code for the data unit, a corrected data unit is generated based on the error correction code. In various embodiments, the data storage controller 110 generates a corrected data unit 305 by correcting the data bit errors in the modified data unit 305 based on the error correction code 310 for the data unit 305. For example, the error correction module 145 of the data storage controller 110 may correct the number of data bit errors in the modified data unit 305 based on the error correction code 310 for the data unit 305. The method 1400 then proceeds to optional step 1485.

In optional step 1485, the bit error indicator is updated. In various embodiments, the data storage controller 110 updates the bit error indicator 300 of the data unit 305. In some embodiments, the bit error indicator generator 125 of the data storage controller 110 identifies a data bit 600 having a data bit error in the data unit 305, based on the error correction code 310 of the data unit 305, and determines whether the data bit 600 has the programmed bit value. If the data bit 600 has the programmed bit value as a correct bit value and the bit error indicator 300 does not identify the bit index of the data bit 600, the bit error indicator generator 125 adds the bit index of the data bit 600 to the bit error indicator 300. In this way, the bit error indicator generator 125 updates the bit error indicator 300 to include the bit index of the data bit 600 having the data bit error (i.e., the erroneous data bit). In various embodiments, the data storage controller 110 updates the bit error indicator 300 without performing a program-erase cycle on a storage block 130 of the data storage module 115, for example by programming data bits in bit error memory 155 from the erased bit value to the programmed bit value.

In some embodiments, the data storage controller 110 remaps a storage block 130 containing bit error indicators 300 when a predetermined error threshold is reached. In one embodiment, the error threshold is reached when the number of data bit errors occurring in the storage block 130 reaches a fixed number. In another embodiment, the error threshold is reached when a storage capacity of the storage block 130 for storing bit error indicators 300 is reached. In still another embodiment, the error threshold is reached when the number of data bit errors occurring in a memory page 200 of the storage block 130 reaches a fixed number. In yet another embodiment, the error threshold is reached when the number of data bit errors occurring in a memory page 200 of the storage block 130 is substantially close to the error correction capacity of the error correction code 310 for the bit error indicators 300 stored in the memory page 200. For example, the number of data bit errors may be one or two less than the error correction capacity of the error correction code 310. In various embodiments, the data storage controller 110 remaps the storage block 130 by performing a program-erase cycle on the storage block 130 or by moving the bit error indicators 300 in the storage block 130 to another storage block 130. The method 1400 then proceeds to step 1455.

In optional step 1490, arrived at from the determination in step 1460 that a bit error indicator is not initialized or the determination in step 1475 that the error correction capacity of the error correction code is exceeded, a RAID recovery operation is performed on the data unit. In various embodiments, the data storage controller 110 performs the RAID recovery operation on the data unit 305. For example, the data recovery module 150 of the data storage controller 110 may perform the RAID recovery operation. The method 1400 then ends.

In the method 1400 illustrated in FIG. 14, the bit error indicator 300 of a data unit 305 need not indicate a correct bit value of a data bit 600 identified as a data bit error in the bit error indicator 300 because the correct bit value is implicitly the erased bit value (i.e., the predetermined bit value). As a result the data size of the bit indicator 300 generated in the method 1400 of FIG. 14 is generally smaller than the data size of the bit indicator 300 generated in the method 1100 of FIG. 11. Accordingly, one advantage of the method 1400 of FIG. 14 over the method 1100 of FIG. 11 is that data storage requirements for bit error indicators 300 are reduced in the method 1400 of FIG. 14 in comparison to the method 1100 of FIG. 11.

Furthermore, because the bit error indicators 300 generated in some embodiments of the method 1400 of FIG. 14 identify data bits 600 that are inadvertently changed from an erased bit value to a programmed bit value, but not data bits 600 that are inadvertently changed from a programmed bit value to an erased bit value, the bit error indicators 300 generated in these embodiments of the method 1400 of FIG. 14 are more indicative of data bit errors caused by a read disturbance than the bit error indicators 300 generated in embodiments of the method 1100 of FIG. 11.

In various embodiments, the method 1400 illustrated in FIG. 14 may include more or fewer than the steps 1405-1490 illustrated in FIG. 14 and described above. In some embodiments, the steps 1405-1490 of the method 1400 illustrated in FIG. 14 may be performed in a different order than the order illustrated in FIG. 14 and described above. In some embodiments, some of the steps 1405-1490 of the method 1400 illustrated in FIG. 14 may be performed in parallel or substantially simultaneously. In various embodiments, one or more of the steps 1405-1490 may be performed more than once in the method 1400 illustrated in FIG. 14.

Figure 15:
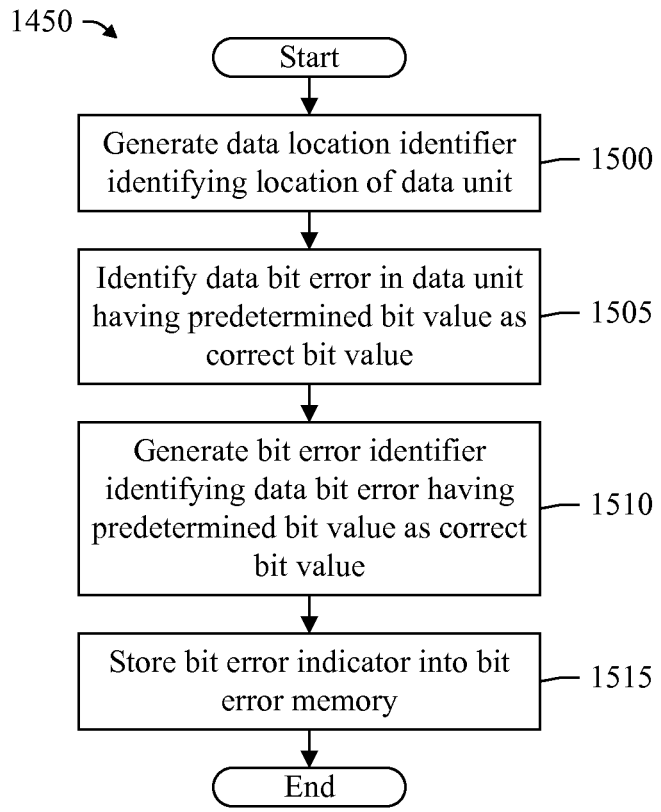
FIG. 15 is a flow chart for a portion of a method of correcting data bit errors in a data unit, in accordance with an embodiment of the present invention.

FIG. 15 illustrates a portion of the method 1400 of correcting a data bit errors in a data unit, in accordance with an embodiment of the present invention. The portion of the method illustrated in FIG. 15 includes embodiments of the step 1450 of the method 1400 for initializing the bit error indicator.

In step 1500, a data location identifier is generated for identifying a location of the data unit having the data bit error. In various embodiments, the bit error indicator 1125 generates a data location identifier 800 for identifying a memory page 200 or a storage block 130, or both, as a location of the data unit 305. The portion of the method 1400 then proceeds to step 1505.

In step 1505, a data bit error is identified in the copy of the data unit for a data unit that has the predetermined bit value as a correct bit value. In various embodiments, the bit manipulation module 135 identifies one or more data bits 600 that are data bit errors in the copy of the data unit 305 and have the predetermined bit value as a correct bit value. For example, the bit manipulation module 135 may identify a data bit 600 having a data bit error in the copy of the data unit 305 by identifying the data bit 600 based on a bit index in the bit error indicator 300. In this way, the bit manipulation module 135 identifies an erroneous data bit 600 having the predetermined bit value as a correct bit value because the correct bit value of each data bit 600 identified as a data bit error by the bit error indicator 300 is implicitly the predetermined bit value. The portion of the method 1100 then proceeds to step 1510.

In step 1510, a bit error identifier is generated for identifying a data bit error in the data unit having the predetermined bit value as a correct bit value. In various embodiments, the bit error indicator 125 generates a bit error identifier 805 of the bit error indicator 300 by identifying a bit index of data bit error in the data unit 305 having the predetermined bit value as a correct bit value based on the error correction code 310 for the data unit 305. In these embodiments, the bit error indicator 300 does not include a bit value indicator 810 for indicating a correct bit value of an data bit error because the correct bit value of each data bit error indicated by the bit error indicator is implicitly the predetermined bit value.

In various embodiments, the predetermined bit value is the erased bit value of data bits in a storage block 130, which is the logic value of each data bit 600 in a storage block 130 after the data storage controller 110 performs an erase operation on the storage block 130 in a program-erase cycle. In contrast to the erased bit value, the programmed bit value is the logic value of a data bit in the storage block 130 that is modified in a program operation of the program-erase cycle. For example, the erased bit value may be a logic value of one and the programmed bit value may be a logic value of zero. Moreover, each data bit 600 indicated as being a data bit error by the bit error indicator 300 has the programmed bit value, which is an erroneous bit value for the data bit 600 because the correct bit value for the data bit 600 is the predetermined bit value (i.e., erased bit value). The portion of the method 1400 then proceeds to step 1515.

In step 1515, the bit error indicator is stored into the bit error memory. In various embodiments, the data storage controller 110 stores the bit error indicator 305 into the bit error memory 155. For example, the bit error indicator generator 125 may store the bit error indicator 305 into a memory page 200 of a storage block 130 in the data storage module 115. The portion of the method 1400 then ends.

Figure 16:
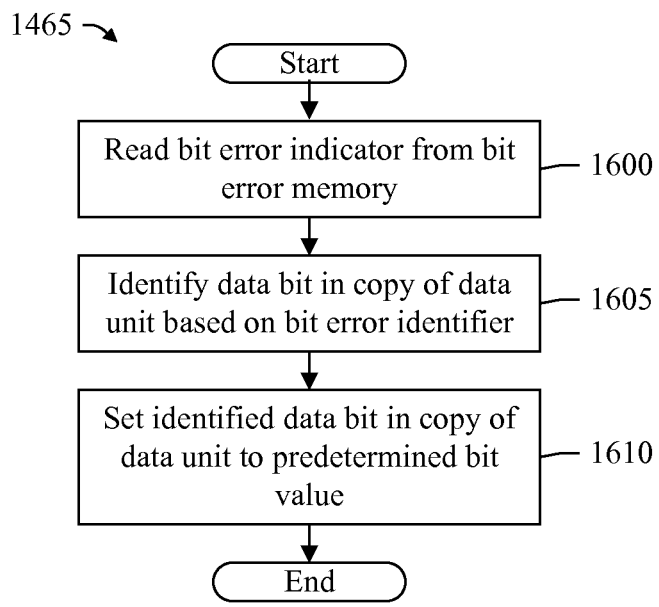
FIG. 16 is a flow chart for a portion of a method of correcting data bit errors in a data unit, in accordance with an embodiment of the present invention.

FIG. 16 illustrates a portion of the method 1200 of correcting a data bit errors in a data unit, in accordance with an embodiment of the present invention. The portion of the method illustrated in FIG. 16 includes embodiments of the step 1465 of the method 1400 for generating a modified data unit.

In step 1600, the bit error indicator associated with the data unit is read from the bit error memory. In various embodiments, the data storage controller 110 reads the bit error indicator 305 associated with the data unit 305 from the bit error memory 155. For example, the bit manipulation module 135 may identify the bit error indicator 305 associated with the data unit 305 based on the data location identifier 800 in the bit error indicator 305 and read the identified bit error indicator 305 from the bit error memory 155. The portion of the method 1400 then proceeds to step 1605.

In step 1605, data bits are identified in the copy of the data unit based on the bit error indicator. In various embodiments, the data storage controller 110 identifies one or more data bits 600 having data bit errors in the copy of the data unit 305 based on the bit error indicator 300 of the data unit 305. For example, the bit manipulation module 135 may identify a data bit 600 having a data bit error in the copy of the data unit 305 based on a bit index in the bit error indicator 300. The portion of the method 1400 then proceeds to step 1610.

In step 1610, the identified data bit in the copy of the data unit is set to the predetermined bit value. In various embodiments, the bit manipulation module 135 sets each data bit 600 identified in the copy of the data unit 305 to the predetermined bit value. In this way, the bit manipulation module 135 corrects each identified data bit 600 that is an erroneous data bit in the copy of the data unit 305.

In various embodiments, the predetermined bit value is an erased bit value of data bits 600 in a storage block 130, which is a logic value of one. For example, a read disturbance of a memory page 200 may have a higher probability of inadvertently changing a data bit 600 having a logic value of one (i.e., an erased bit value) to a logic value of zero (i.e., a programmed bit value) than inadvertently changing a data bit 600 having a logic value of zero to a logic value of one. In this example, the data storage system 105 modifies the copy of the data unit 305 by setting one or more data bits 600 identified by the bit error indicator 300 to a logic value of one (i.e., the predetermined bit value) in the copy of the data unit 305, which is the correct bit value of the data bits. In these embodiments, the bit error identifier 805 indicates the correct bit value (i.e., the predetermined bit value) of a data bit implicitly by identifying the bit index of the data bit. The portion of the method 1400 then ends.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:
1. A system comprising:
a data storage module including a storage block having a memory page; and
a data storage controller coupled to the data storage module for reading data from and writing data to the data storage module, the data storage controller including:
an error correction module for reading a data unit from the memory page and for generating a corrected data unit by using an error correction code for the data unit when a number of data bit errors in the data unit does not exceed an error correction capacity of the error correction code;

a bit error indicator generator for generating, during an initial reading of the data unit and the error correction code of the data unit, a bit error indicator for the number of data bit errors detected in the initial reading of the data unit based on the error correction code for the data unit, the bit error indicator including a bit index for each of the data bit errors detected in the initial read of the data unit based on the error correction code for the data unit and including a correct bit value for each data bit error identified by the bit error indicator and storing the bit index and the correct bit value for each of the data bit errors detected during the initial read of the data unit into the data storage module; and a bit manipulation module operable, upon a subsequent reading of the data unit and the error correction code of the data unit from the memory page and when the number of data bit errors detected on the subsequent reading of the data unit exceeds the error correction capacity of the error correction code, to generate a modified data unit having a number of data bit errors within the error correction capacity of the error correction code, the modified data unit generated by using the bit index and the correct bit value of the bit error indicator generated during the initial read of the data unit and stored in the data storage module to correct the number of data bit errors in the data unit that exceeds the error correction capacity of the error correction code and the error correction module operable to use the error correction code of the data unit to correct the remaining errors in the data unit to generate a corrected data unit from the modified data unit.

2. The system of claim 1, wherein the bit manipulation module is further configured to update the bit error indicator to identify a bit index of an additional data bit error in the subsequent reading of the data unit.

3. The system of claim 1, wherein the data storage controller is further configured to perform an erase operation on the storage block, store the data unit into the memory page of the storage block, and to initially store the bit error indicator into the data storage module without first performing a subsequent erase operation on the storage block.

4. The system of claim 1, wherein the bit error indicator includes a data location identifier for identifying a location of the data unit in the data storage module, and further includes a bit error identifier for identifying the bit index of the data bit error.

5. The system of claim 4, wherein the data unit includes a plurality of data segments, and the data location identifier identifies a data segment including the data bit error.

6. A method comprising:
generating an error correction code for a data unit, the error correction code having an error correction capacity for correcting up to a predetermined number of data bit errors in the data unit;
storing the data unit and the error correction code into a memory page of a storage block;
reading the data unit and the error correction code from the memory page in a first read operation;
detecting a number of data bit errors in the data unit read from the memory page in the first read operation based on the error correction code;
initializing a bit error indicator for the first read operation, the bit error indicator including a bit index for each data bit error detected in the data unit read from the memory page in the first read operation based on the error correction code for the data unit and including a correct bit value for each data bit error identified by the bit error indicator;
storing the bit index and correct bit value for each of the data bit errors detected during the first read operation of the data unit into the storage block;
reading the data unit and the error correction code from the memory page in a second read operation subsequent to the first read operation;
generating a modified data unit having a number of data bit errors within the error correction capacity of the error correction code when the number of data bit errors of the data unit exceeds the error correction capacity of the error correction code, wherein the modified data unit is generated by using the bit index and the correct bit value of the bit error indicator generated during the first read operation of the data unit and stored in the storage block to correct the number of data bit errors in the data unit that exceeds the error correction capacity of the error correction code;
detecting a number of remaining data bit errors in the modified data unit based on the error correction code; and
generating a corrected data unit by correcting the number of remaining data bit errors in the modified data unit based on the error correction code.

7. The method of claim 6, wherein the bit error indicator includes a data location identifier for identifying the memory page, and further includes a bit error identifier for identifying the bit index of each data bit error in the data unit read from the memory page in the first read operation.

8. The method of claim 7, wherein the data unit includes a plurality of data segments, and the data location identifier identifies a data segment having at least one data bit error in the data segment.

9. The method of claim 6, further comprising:
updating the bit error indicator to include a bit index of an additional data bit detected as being a data bit error in the data unit read from the memory page in the second read operation and to include a correct bit value of the additional data bit;
reading the data unit from the memory page in a third read operation subsequent to the second read operation;
generating an additional modified data unit based on the data unit read from the memory page in the third read operation by using the updated bit error indicator to correct at least one data bit error in the additional modified data unit; and
generating an additional corrected data unit by correcting the number of data bit errors in the additional modified data unit based on the error correction code.

10. The method of claim 6, wherein the bit error indicator indicates data bit errors occurring in the data unit between successive program-erase cycles performed on the storage block, and wherein the data unit is not modified in the memory page between the successive program-erase cycles after storing the data unit into the memory page.

11. A system comprising:
a data storage module including a storage block having a memory page; and
a data storage controller coupled to the data storage module for reading data from and writing data to the data storage module, the data storage controller including:
an error correction module for reading a data unit from the memory page and for generating a corrected data unit by using an error correction code for the data unit when a number of data bit errors in the data unit does not exceed an error correction capacity of the error correction code;

a bit error indicator generator for generating, during an initial read of the data unit, a bit error indicator for the number of data bit errors detected in the data unit based on the error correction code for the data unit, the bit error indicator including a bit index for one or more erroneous data bits detected on the initial read of the data unit and including a programmed bit value for each data bit error identified by the bit error indicator;

storing the bit index for one or more erroneous data bits and the programmed bit value for each data bit error detected during the initial read of the data unit into the data storage module; and a bit manipulation module operable upon a subsequent reading of the data unit from the memory page to generate a modified data unit by using the bit error indicator generated during the initial read of the data unit to set each of the one or more erroneous data bits to an erased bit value, the data storage controller operable to use the error correction code to generate a corrected data unit based on the modified data unit.

12. The system of claim 11, wherein the bit manipulation module is further configured to update the bit error indicator to identify a bit index of an additional data bit error in the subsequent reading of the data unit.

13. The system of claim 11, wherein the data storage controller is further configured to perform an erase operation on the storage block, store the data unit into the memory page of the storage block, and to initially store the bit error indicator into the data storage module without first performing a subsequent erase operation on the storage block.

14. The system of claim 11, wherein the bit error indicator includes a data location identifier for identifying a location of the data unit in the data storage module, and further includes a bit error identifier for identifying the bit index of the data bit error.

15. The system of claim 14, wherein the data unit includes a plurality of data segments, and the data location identifier identifies a data segment including the data bit error.

16. A method comprising:

generating an error correction code for a data unit, the error correction code having an error correction capacity for correcting up to a predetermined number of data bit errors in the data unit;

storing the data unit into a memory page of a storage block;

reading the data unit from the memory page in a first read operation;

detecting a number of data bit errors in the data unit read from the memory page in the first read operation based on the error correction code;

initializing a bit error indicator, the bit error indicator including a bit index for each data bit error detected in the data unit read from the memory page in the first read operation based on the error correction code for the data unit and including a programmed bit value for each data bit error identified by the bit error indicator;

reading the data unit from the memory page in a second read operation subsequent to the first read operation;

generating a modified data unit based on the data unit read from the memory page in the second read operation by using the bit error indicator generated during the first read operation to set each data bit error to an erased bit value;

detecting a number of data bit errors in the modified data unit based on the error correction code; and generating a corrected data unit by correcting the number of data bit errors in the modified data unit based on the error correction code.

17. The method of claim 16, wherein the bit error indicator includes a data location identifier for identifying the memory page, and further includes a bit error identifier for identifying the bit index of each data bit error in the data unit read from the memory page in the first read operation.

18. The method of claim 17, wherein the data unit includes a plurality of data segments, and the data location identifier identifies a data segment having at least one data bit error in the data segment.

19. The method of claim 16, further comprising:

updating the bit error indicator to identify a bit index of an additional data bit error in the data unit read from the memory page in the second read operation and having the programmed bit value;

reading the data unit from the memory page in a third read operation subsequent to the second read operation;

generating an additional modified data unit based on the data unit data unit read from the memory page in the third read operation by setting each data bit in the additional modified data unit at a respective bit index identified by the updated bit error indicator to the erased bit value; and generating an additional corrected data unit by correcting the number of data bit errors in the additional modified data unit based on the error correction code.

20. The method of claim 16, wherein the bit error indicator indicates data bit errors occurring in the data unit between successive program-erase cycles performed on the storage block, and wherein the data unit is not modified in the memory page between the successive program-erase cycles after storing the data unit into the memory page.

* * * * *